(12) United States Patent
Sturcken et al.

(10) Patent No.: US 11,197,374 B2
(45) Date of Patent: Dec. 7, 2021

(54) INTEGRATED SWITCHED INDUCTOR POWER CONVERTER HAVING FIRST AND SECOND POWERTRAIN PHASES

(71) Applicant: Ferric Inc., New York, NY (US)

(72) Inventors: Noah Sturcken, New York, NY (US); Joseph Meyer, Plainsboro, NJ (US); Michael Lekas, Brooklyn, NY (US); Ryan Davies, New York, NY (US); David Jew, New York, NY (US); William Lee, New York, NY (US)

(73) Assignee: Ferric Inc., New York, NY (US)

( * ) Notice: Subject to any disclaimer, the term of this patent is extended or adjusted under 35 U.S.C. 154(b) by 36 days.

(21) Appl. No.: 16/279,574

(22) Filed: Feb. 19, 2019

(65) Prior Publication Data

US 2019/0182957 A1 Jun. 13, 2019

Related U.S. Application Data

(60) Continuation-in-part of application No. 15/844,107, filed on Dec. 15, 2017, now Pat. No. 10,244,633, (Continued)

(51) Int. Cl.
*H02M 3/158* (2006.01)
*H05K 1/18* (2006.01)
(Continued)

(52) U.S. Cl.
CPC ......... *H05K 1/181* (2013.01); *H01F 17/0006* (2013.01); *H01F 27/24* (2013.01);
(Continued)

(58) Field of Classification Search
None
See application file for complete search history.

(56) References Cited

U.S. PATENT DOCUMENTS 1,553,983 A 9/1925 Casper
2,931,966 A 4/1960 Rockey
(Continued)

FOREIGN PATENT DOCUMENTS

FR 2817622 A1 6/2002
FR 2905792 A1 3/2008
(Continued)

OTHER PUBLICATIONS

N. Sturcken et al., "Design of Coupled Power Inductors with Crossed Anisotropy Magnetic Core for Integrated Power Conversion", IEEE-APEC 2012, p. 417-423, doi: 10.1109/APEC.2012.6165853.

(Continued)

*Primary Examiner* — Jeffrey A Gblende
(74) *Attorney, Agent, or Firm* — Intrinsic Law Corp.

(57) ABSTRACT

A switched inductor DC-DC power converter chiplet includes a CMOS power switch, an LC filter, regulation circuitry, feedback control circuitry, and interface control circuitry integrated on a common substrate. The inductor for the LC filter can be formed on the same surface or on opposing surfaces of the substrate as the electrical terminations for the substrate. Another embodiment includes a switched inductor DC-DC power converter chiplet having a first powertrain phase and multiple second powertrain phases. When the load current is less than or equal to a threshold load current, the power conversion efficiency can be improved by only operating the first powertrain phase. When the load current is greater than the threshold load current, the power conversion efficiency can be improved by operating one or more second powertrain phases.

19 Claims, 24 Drawing Sheets

Related U.S. Application Data which is a continuation-in-part of application No. 14/814,033, filed on Jul. 30, 2015, now Pat. No. 9,847,718, and a continuation-in-part of application No. 14/991,111, filed on Jan. 8, 2016, now Pat. No. 10,028,385, which is a continuation of application No. 14/517,370, filed on Oct. 17, 2014, now Pat. No. 9,357,651, which is a division of application No. 13/609,391, filed on Sep. 11, 2012, now Pat. No. 9,844,141.

(60) Provisional application No. 62/032,758, filed on Aug. 4, 2014.

(51) Int. Cl.

| | | |
|---|---|---|
| *H05K 1/11* | (2006.01) | |
| *H05K 1/02* | (2006.01) | |
| *H01F 27/24* | (2006.01) | |
| *H01F 27/28* | (2006.01) | |
| *H01F 41/02* | (2006.01) | |
| *H01F 41/04* | (2006.01) | |
| *H05K 1/16* | (2006.01) | |
| *H02M 3/00* | (2006.01) | |
| *H01F 17/00* | (2006.01) | |
| *H05K 1/03* | (2006.01) | |
| *H02M 1/00* | (2006.01) | |

(52) U.S. Cl.
CPC ......... *H01F 27/2804* (2013.01); *H01F 41/02* (2013.01); *H01F 41/041* (2013.01); *H02M 3/00* (2013.01); *H02M 3/1584* (2013.01); *H05K 1/0298* (2013.01); *H05K 1/115* (2013.01); *H05K 1/165* (2013.01); *H01F 2017/0086* (2013.01); *H02M 1/0032* (2021.05); *H02M 1/0054* (2021.05); *H05K 1/0233* (2013.01); *H05K 1/0306* (2013.01); *H05K 2201/086* (2013.01); *H05K 2201/0929* (2013.01); *H05K 2201/1003* (2013.01); *Y02P 70/50* (2015.11)

(56) References Cited

U.S. PATENT DOCUMENTS

| | | | |
|---|---|---|---|
| 3,110,613 A | 11/1963 | Bean | |
| 3,543,249 A | 11/1970 | Bobeck et al. | |
| 3,573,760 A | 4/1971 | Chang et al. | |
| 3,614,554 A | 10/1971 | Shield et al. | |
| 4,025,379 A | 5/1977 | Whetstone | |
| 4,103,315 A | 7/1978 | Hempstead et al. | |
| 4,236,946 A | 12/1980 | Aboaf et al. | |
| 5,070,317 A | 12/1991 | Bhagat | |
| 5,079,534 A | 1/1992 | Steingroever et al. | |
| 5,225,971 A | 7/1993 | Spreen | |
| 5,319,343 A | 6/1994 | Jeffries | |
| 5,583,474 A | 12/1996 | Mizoguchi | |
| 5,635,892 A | 6/1997 | Ashby | |
| 5,831,431 A | 11/1998 | Gottfried-Gottfried et al. | |
| 5,912,553 A | 6/1999 | Mengelkoch | |
| 6,118,351 A | 9/2000 | Kossives et al. | |
| 6,362,986 B1 | 3/2002 | Schultz | |
| 6,542,060 B2 | 4/2003 | Fedeli | |
| 6,542,379 B1 | 4/2003 | Lauffer | |
| 6,856,226 B2 | 2/2005 | Gardner | |
| 6,940,384 B2 | 9/2005 | Hooey et al. | |
| 7,230,408 B1 | 6/2007 | Vinn et al. | |
| 7,554,399 B1 | 6/2009 | Gaboriau et al. | |
| 7,636,242 B2 | 12/2009 | Hazucha | |
| 7,719,084 B2 | 5/2010 | Gardner | |
| 7,791,837 B2 | 9/2010 | Fujiwara | |
| 7,867,787 B2 | 1/2011 | Gardner | |
| 7,868,431 B2 | 1/2011 | Feng et al. | |
| 7,875,955 B1 | 1/2011 | Hopper et al. | |
| 8,108,984 B2 | 2/2012 | Gardner | |
| 8,270,137 B2 * | 9/2012 | Briere | H02M 3/158 361/100 |
| 8,288,277 B2 | 10/2012 | Takahashi et al. | |
| 8,432,144 B2 | 4/2013 | Notani | |
| 8,558,344 B2 | 10/2013 | Chen | |
| 9,047,890 B1 | 6/2015 | Herget | |
| 2002/0060621 A1 | 5/2002 | Duffy et al. | |
| 2002/0136929 A1 | 9/2002 | Oikawa et al. | |
| 2003/0005569 A1 | 1/2003 | Hiatt et al. | |
| 2003/0070282 A1 | 4/2003 | Hiatt et al. | |
| 2003/0090244 A1 * | 5/2003 | Shenai | G06F 1/3203 323/259 |
| 2003/0160677 A1 | 8/2003 | Fujiwara et al. | |
| 2004/0009614 A1 | 1/2004 | Ahn et al. | |
| 2004/0135661 A1 | 7/2004 | Haugs et al. | |
| 2004/0196019 A1 * | 10/2004 | Schneider | H02M 3/1584 323/285 |
| 2005/0088269 A1 | 4/2005 | Hatano et al. | |
| 2005/0156704 A1 | 7/2005 | Gardner et al. | |
| 2006/0197510 A1 | 9/2006 | Chandrasekaran | |
| 2006/0263727 A1 | 11/2006 | Lee et al. | |
| 2006/0273418 A1 | 12/2006 | Chung et al. | |
| 2007/0037414 A1 | 2/2007 | Yamauchi et al. | |
| 2007/0290362 A1 | 12/2007 | Hsu et al. | |
| 2008/0003699 A1 | 1/2008 | Gardner et al. | |
| 2008/0023791 A1 | 1/2008 | Muthukumar et al. | |
| 2008/0172861 A1 | 7/2008 | Holmes | |
| 2008/0316647 A1 | 12/2008 | Joisten | |
| 2009/0007418 A1 | 1/2009 | Edo et al. | |
| 2009/0068762 A1 | 3/2009 | Takahashi et al. | |
| 2009/0128274 A1 | 5/2009 | Park et al. | |
| 2009/0175014 A1 | 7/2009 | Zeng et al. | |
| 2009/0188104 A1 | 7/2009 | Ching et al. | |
| 2011/0208019 A1 | 8/2011 | Sato et al. | |
| 2011/0279214 A1 | 11/2011 | Lee et al. | |
| 2012/0086416 A1 * | 4/2012 | Kudo | G06F 1/26 323/265 |
| 2012/0154966 A1 | 6/2012 | Wolfus et al. | |
| 2013/0027170 A1 | 1/2013 | Chen | |
| 2013/0056847 A1 | 3/2013 | Chen | |
| 2013/0099334 A1 | 4/2013 | Mohan | |
| 2013/0099762 A1 | 4/2013 | Terrovitis | |
| 2013/0206845 A1 | 8/2013 | Koujima et al. | |
| 2013/0234821 A1 | 9/2013 | Shim | |
| 2014/0027879 A1 | 1/2014 | Weyers et al. | |
| 2014/0062646 A1 | 3/2014 | Morrissey et al. | |
| 2014/0068932 A1 | 3/2014 | Sturcken | |
| 2014/0071636 A1 | 3/2014 | Sturcken | |
| 2014/0240074 A1 | 8/2014 | Qui et al. | |
| 2015/0036308 A1 | 2/2015 | Sturcken | |
| 2015/0302974 A1 | 10/2015 | Zhao et al. | |
| 2016/0126008 A1 | 5/2016 | Sturcken | |

FOREIGN PATENT DOCUMENTS

| | | |
|---|---|---|
| JP | S5821810 A | 2/1983 |
| JP | 60124859 A | 7/1985 |
| JP | 01028957 A | 1/1989 |
| JP | 05082736 A | 4/1993 |
| JP | 05291063 | 11/1993 |
| JP | H09162354 A | 6/1997 |
| JP | H10284314 A | 10/1998 |
| JP | 2000068133 A | 3/2000 |
| JP | 2002190411 A | 7/2002 |
| JP | 2006228824 A | 8/2006 |
| WO | WO2012166877 A1 | 12/2012 |

OTHER PUBLICATIONS

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering

(56) References Cited

OTHER PUBLICATIONS 10.8A/mm", IEEE International Solid-State Circuits Conference, Feb. 22, 2012, p. 3-5, Session 23, IEEE.
N. A. Sturcken, "Integrated Voltage Regulators with Thin-Film Magnetic Power Inductors", 2013, pp. 1-166, Columbia University.
ISA, "International Search Report", PCT/US2018/036832, dated Aug. 28, 2018.

* cited by examiner

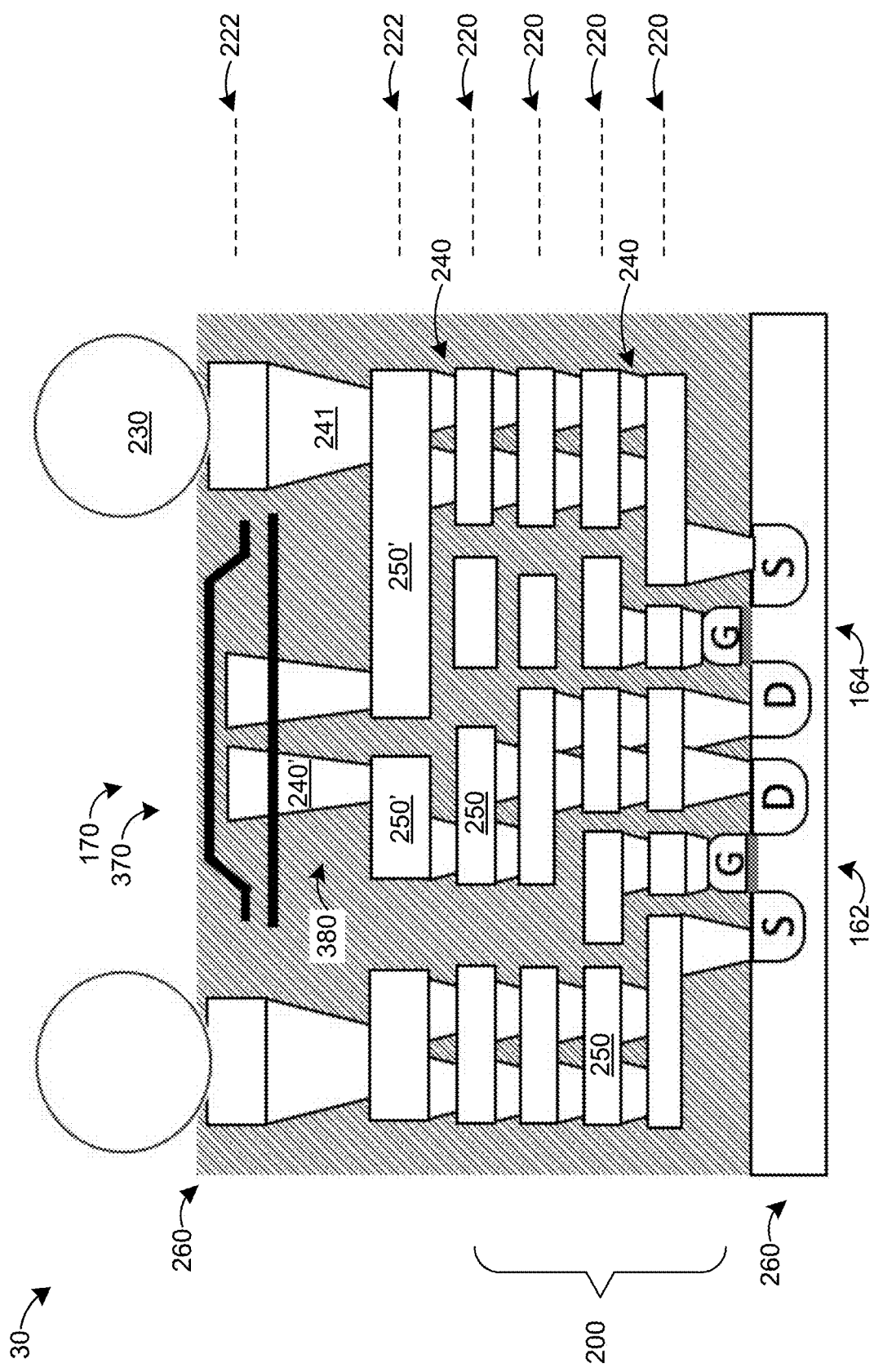

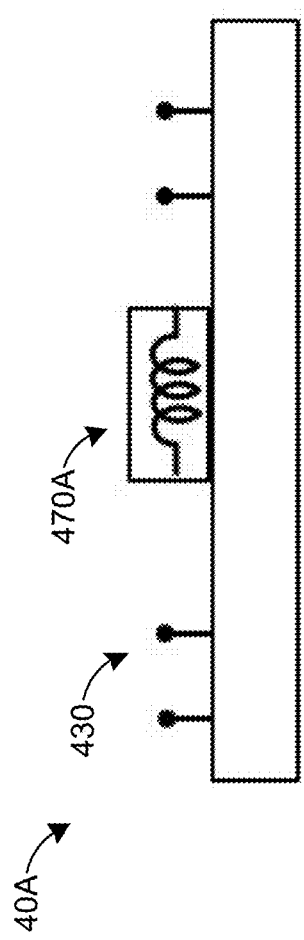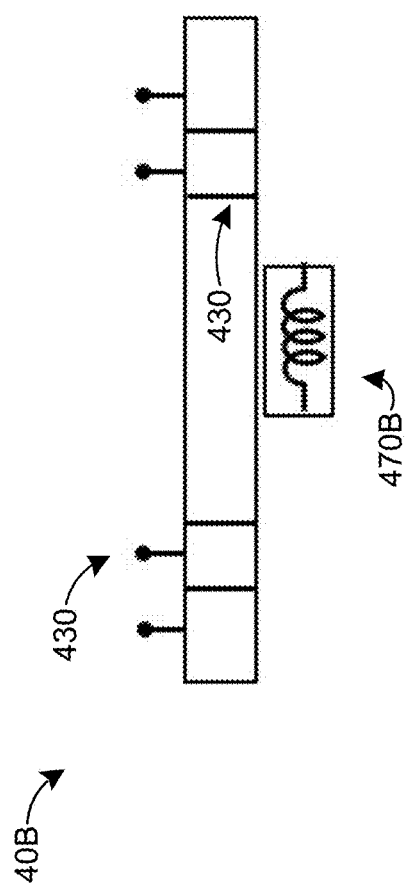

INTEGRATED SWITCHED INDUCTOR POWER CONVERTER HAVING FIRST AND SECOND POWERTRAIN PHASES

CROSS-REFERENCE TO RELATED APPLICATIONS

This application is a continuation-in-part of U.S. patent application Ser. No. 15/844,107, filed on Dec. 15, 2017, titled "Integrated Switched Inductor Power Converter," which is a continuation-in-part of U.S. patent application Ser. No. 14/814,033, filed on Jul. 30, 2015, titled "Apparatus and Methods for Integrated Power Converter with High Bandwidth," which claims the benefit of U.S. Provisional Application No. 62/032,758, filed on Aug. 4, 2014, titled "Apparatus and Methods for Integrated Power Converter with High Bandwidth." In addition, U.S. patent application Ser. No. 15/844,107 is a continuation-in-part of U.S. patent application Ser. No. 14/991,111, now U.S. Pat. No. 10,028,385, filed on Jan. 8, 2016, titled "Magnetic Core Inductor Integrated with Multilevel Wiring Network," which is a continuation of U.S. patent application Ser. No. 14/517,370, now U.S. Pat. No. 9,357,651, filed on Oct. 17, 2014, titled "Magnetic Core Inductor Integrated with Multilevel Wiring Network," which is a divisional of U.S. patent application Ser. No. 13/609,391, now U.S. Pat. No. 9,844,141, filed on Sep. 11, 2012, titled "Magnetic Core Inductor Integrated with Multilevel Wiring Network." This application is also related to U.S. patent application Ser. No. 13/613,011, now U.S. Pat. No. 9,357,650, filed on Sep. 13, 2012, titled "Magnetic Core Inductor Integrated with Multilevel Wiring Network." This application claims the benefit of and priority to the above, and each of the foregoing is hereby incorporated by reference.

TECHNICAL FIELD

The present application relates generally to power converters for integrated circuits.

BACKGROUND

Switched inductor DC-DC power converters and buck converters provide conversion of power from a high voltage potential to a low voltage potential. These types of converters are used in a broad and diverse set of applications. One typical application is the conversion and regulation of power supplies for microprocessors and other sensitive or high performance integrated circuits.

With the development of highly integrated electronic systems that consume large amounts of electricity in very small areas, the need arises for new technologies that enable improved energy efficiency and power management for future integrated systems.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

An aspect of the invention is directed to a switched inductor DC-DC power converter, comprising: a first powertrain phase having a first maximum power conversion efficiency at a first load current and comprising: a first power switch; and a first thin-film inductor electrically coupled to an output of the second power switch. The switched inductor DC-DC power converter also comprises second powertrain phases in parallel electrically with one another and in parallel electrically with the first powertrain phase, each second powertrain phase having a second maximum power conversion efficiency at a second load current and comprising: a second power switch; and a second thin-film inductor electrically coupled to an output of the first power switch. The switched inductor DC-DC power converter also comprises control circuitry in electrical communication with the first and second powertrain phases, the control circuitry varying a number of the first and second powertrain phases that are electrically coupled to a power delivery channel, the number varied to maximize a power conversion efficiency for delivering an output current to a load, wherein the first load current is different than the second load current.

In one or more embodiments, only the first powertrain phase is electrically coupled to the power delivery channel when a target output current is less than or equal to a threshold output current. In one or more embodiments, at least one second powertrain phase is electrically coupled to the power delivery channel when the target output current is greater than the threshold output current. In one or more embodiments, two second powertrain phases are electrically coupled to the power delivery channel when the target output current is twice the second load current or higher. In one or more embodiments, M second powertrain phases are electrically coupled to the power delivery channel when the target output current is at least M×the second load current.

In one or more embodiments, the threshold output current is about 100 mA. In one or more embodiments, the first load current is about 50 mA. In one or more embodiments, the second load current is about 500 mA. In one or more embodiments, the switched inductor DC-DC power converter further comprises an output capacitor in parallel electrically with the power delivery channel. In one or more embodiments, the first powertrain includes a first LC filter that comprises the first thin-film inductor and the output capacitor, and each second powertrain includes a second LC filter that comprises the second thin-film inductor and the output capacitor.

In one or more embodiments, the control circuitry regulates a switching frequency and duty cycle of the first and second power switches to adjust the output current such that is equal to a target output current. In one or more embodiments, the switched inductor DC-DC power converter is integrated on a common substrate. In one or more embodiments, the switched inductor DC-DC power converter is integrated on a common substrate that comprises a multilevel wiring network, and the first inductor and each second inductor are integrated in the multilevel wiring network. In one or more embodiments, the multilevel wiring network includes first and second integration layers, and the first inductor and each second inductor are integrated in the first and second integration layers.

In one or more embodiments, the multilevel wiring network includes first, second, third, and fourth integration layers, each second inductor is integrated in the first and second integration layers, and the first inductor is integrated in the third and fourth integration layers. In one or more embodiments, the first and second integration layers are disposed closer to the substrate than the third and fourth integration layers. In one or more embodiments, the multi-level wiring network includes first, second, and third integration layers, the second inductors comprise first and second solenoid inductors that are integrated in the first and second integration layers, the first and second solenoid inductors including respective first and second ferromagnetic cores, the first inductor comprises a spiral inductor that is integrated in a third integration layer, and the spiral inductor includes at least a portion of the first and second ferromagnetic cores.

Another aspect of the invention is directed to a system comprising: a power converter substrate comprising: a first CMOS power switch; second CMOS power switches; regulation circuitry electrically coupled to inputs of the first and second CMOS power switches; feedback control circuitry that regulates a switching frequency of the first and second CMOS power switches; and an interposer comprising a first thin-film inductor and second thin film inductors, wherein: an input of the first thin-film inductor is electrically coupled to an output of the first CMOS power switch, and an input of each second thin-film inductor is electrically coupled to an output of each second CMOS power switch. In one or more embodiments, the interposer comprises an integrated passive device.

BRIEF DESCRIPTION OF THE DRAWINGS

For a fuller understanding of the nature and advantages of the present invention, reference is made to the following detailed description of preferred embodiments and in connection with the accompanying drawings.

FIG. 3 is a cross section of the switched inductor DC-DC power converter chiplet illustrated in FIG. 1 according to a second embodiment.

FIG. 4A is a schematic of switched inductor DC-DC power converter chiplets to illustrate possible locations to integrate the thin-film inductor.

FIG. 4B is another schematic of switched inductor DC-DC power converter chiplets to illustrate possible locations to integrate the thin-film inductor.

DETAILED DESCRIPTION

Figure 1:
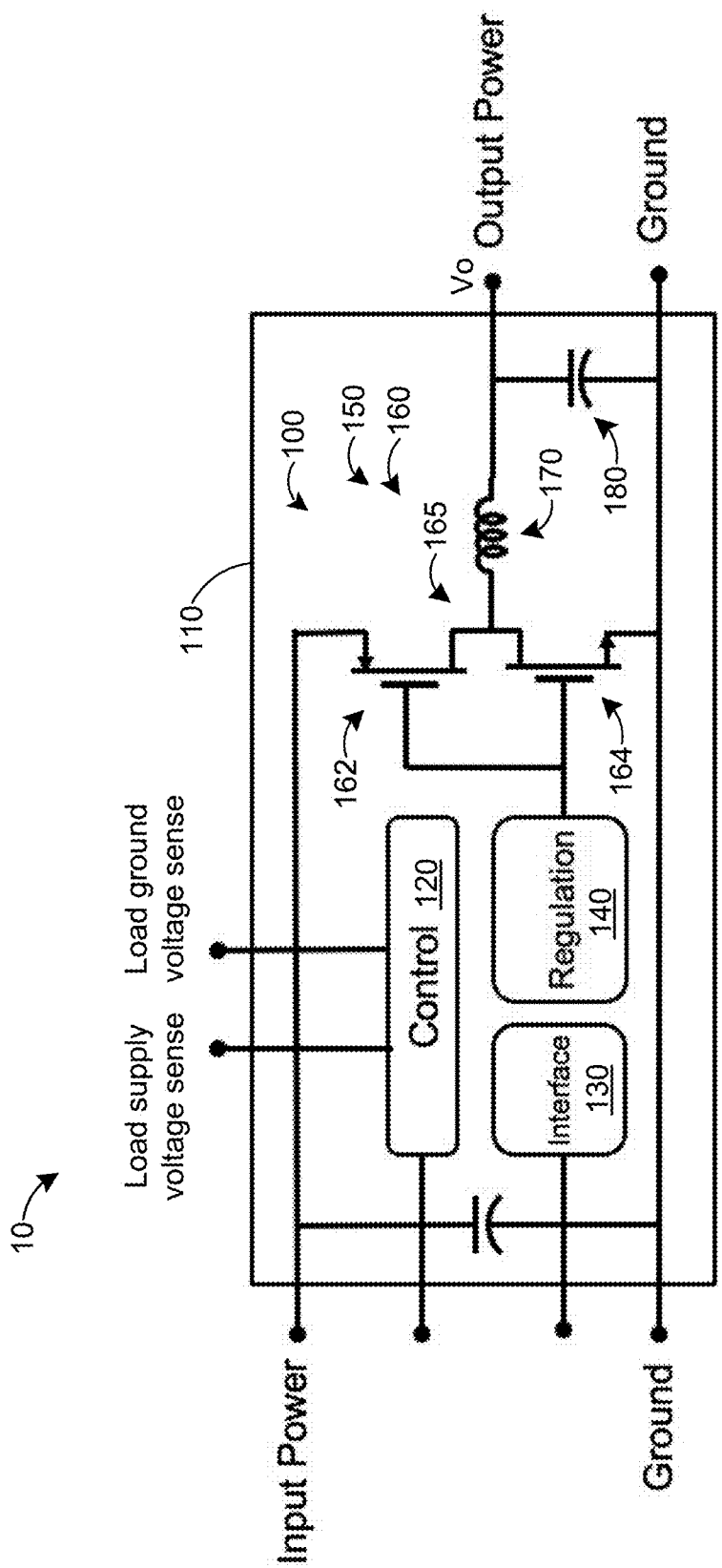
FIG. 1 is a schematic representation of a switched inductor DC-DC power converter chiplet according to one or more embodiments.

FIG. 1 is a schematic representation of a switched inductor DC-DC power converter chiplet 10 according to one or more embodiments. A switched inductor DC-DC power converter 100 is fabricated and/or integrated on a common power converter substrate 110, such as a silicon substrate. The switched inductor DC-DC power converter 100 includes feedback control circuitry 120, interface circuitry 130, regulation circuitry 140, and powertrain 150. Powertrain 150 includes power switch 160, thin-film inductor 170, and output capacitor 180. Power switch 160 can be a CMOS power switch comprising PMOS and NMOS transistor gates 162, 164, respectively. Each transistor gate 162, 164 can include two switches in series in a cascode configuration, as discussed below.

Feedback control circuitry 120 is configured to open and close PMOS and NMOS transistor gates 162, 164. When PMOS transistor gate 162 is open, NMOS transistor gate 164 is closed and vice-versa. Opening and closing PMOS and NMOS transistor gates 162, 164 generates a pulse width modulation (PWM) signal at the output of half-bridge node 165. The frequency of the PWM signal can be configured in feedback control circuitry as known in the art. Feedback control circuitry 120 is configured to adjust the duty cycle of the PWM signal and/or to adjust the switching frequency of the PMOS and NMOS transistor gates 162, 164 to raise or lower the output voltage Vo so that the output voltage Vo equals a target output voltage. Feedback control circuitry 120 monitors the output voltage Vo through load supply voltage sense and load ground sense feedback lines, as illustrated in FIG. 1. The separate supply voltage sense and ground reference sense lines allow the power converter chiplet 10 to measure the output voltage at the load independent of the power delivery channel.

Feedback control circuitry 120 calculates a voltage error, which is the difference between the output voltage Vo and the target output voltage. The target output voltage can be set manually or pre-programmed based on the specifications of the load. If there is a positive voltage error (i.e., the output voltage Vo is greater than the target output voltage), feedback control circuitry 120 can respond by decreasing the duty cycle of the PWM signal generated by power switch 160 and/or by adjusting (e.g., decreasing or increasing) the switching frequency of the PMOS and NMOS transistor gates 162, 164. If there is a negative voltage error (i.e., the actual output voltage Vo is less than the target output voltage), feedback control circuitry 120 can respond by increasing the duty cycle of the PWM signal generated by power switch 160 and/or by adjusting (e.g., decreasing or increasing) the switching frequency of the PMOS and NMOS transistor gates 162, 164.

Interface circuitry 130 providing an interface connection or connections between one or more electrical contact points on said chip or circuit and one or more electrical contact points off of said chip or circuit.

Regulation circuitry 140 is configured to open and close the PMOS and NMOS transistor gates 162, 164 according to the PWM signal generated by control circuitry 120.

Thin-film inductor 170 and output capacitor 180 form a low pass filter as known in the art. The thin-film inductor 170 is formed in the multilevel wiring network of the power converter substrate 110 as described herein. The thin-film inductor 170 can include a magnetic core inductor and/or a magnetic clad inductor.

In some embodiments, one or more digital processing units, such as a microprocessor and/or a graphics processor are disposed on the common power converter substrate 110.

Figure 1A:
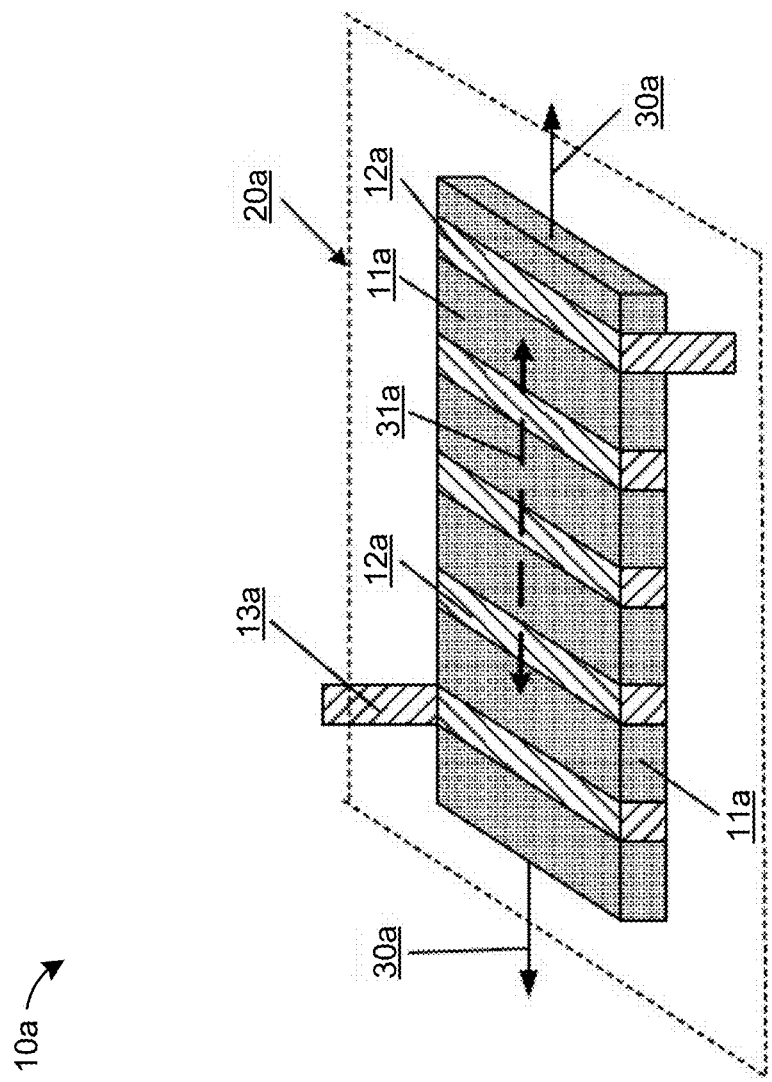
FIG. 1A shows a schematic view of a planar magnetic core inductor with windings on the outside.

FIG. 1A shows a schematic view of a planar magnetic core inductor 10a with windings on its outside as can be used in the inductors described herein. The magnetic core 11a is a planar structure having, and defining, a principal plane 20a. The planar magnetic core 11a may typically be of a rectangular shape. The conductive winding 12a of the inductor is made to spiral around the outside of the planar core 11a. The conductive winding 12a has leads 13a that may connect to the winding in any desirable manner without limitation.

The direction 30a of a magnetic field that is induced when an electrical current is flowing in the conductive winding 12a is substantially in the principal plane directed substantially along the winding spiral, and pointing in a direction that depends on the direction of the current in the winding. As it is known in the art, many magnetic material are anisotropic, and possess so called hard and soft axes of magnetization. The planar magnetic core 11a in representative embodiments of the invention is fabricated to have its hard-axis 31a of magnetization aligned substantially in parallel with the magnetic field 30a that is induced when an electrical current is flowing in the conductive windings 12a. Such an alignment for the material of the magnetic core 11a is desirable because along the hard-axis the core magnetization exhibits less hysteresis and has a substantially linear dependence on the current in the winding 12a, resulting in more energy efficient operation of the inductor.

Figure 2:
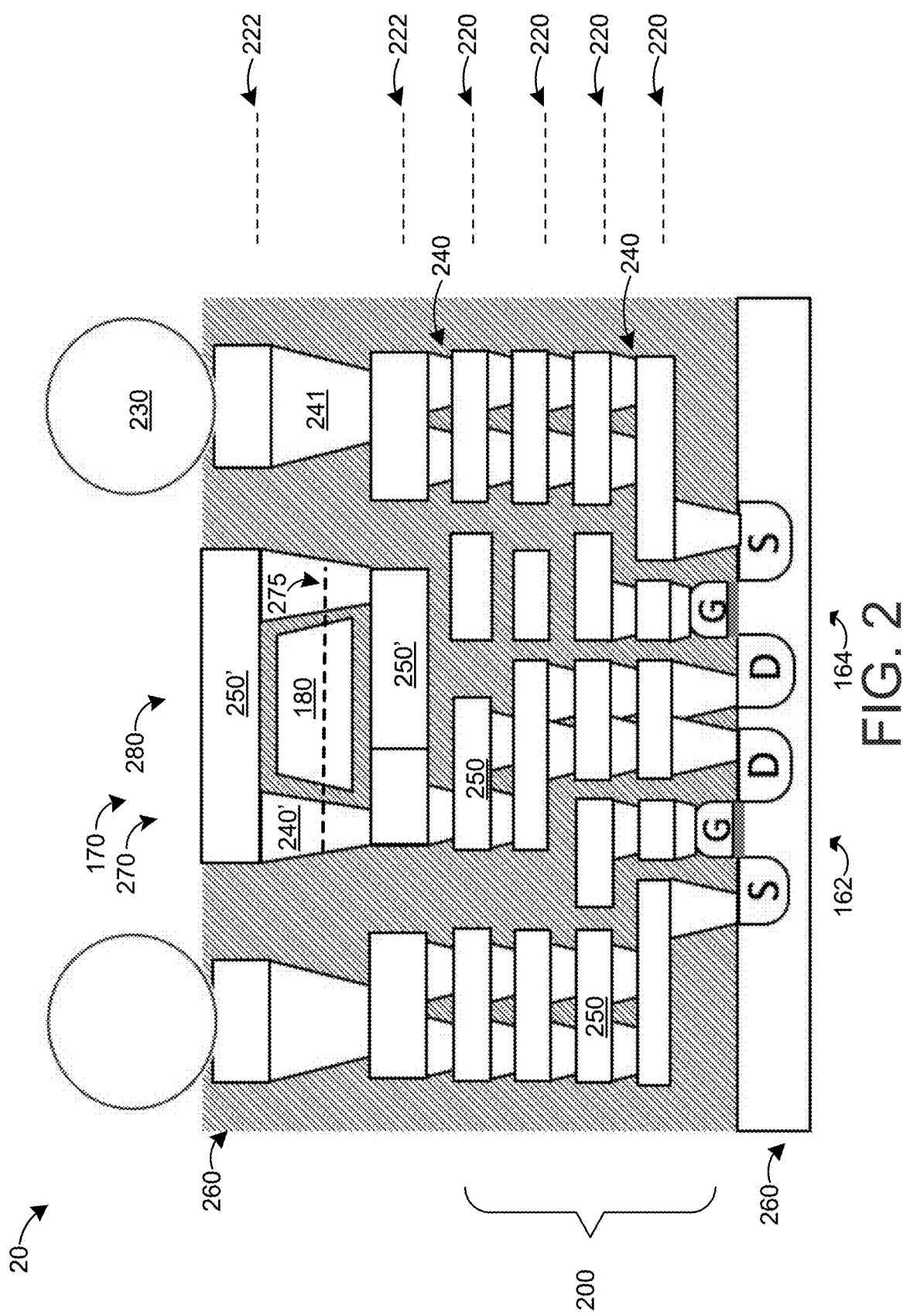
FIG. 2 is a cross section of the switched inductor DC-DC power converter chiplet illustrated in FIG. 1 according to a first embodiment.

FIG. 2 is a cross section 20 of the switched inductor DC-DC power converter chiplet 10 illustrated in FIG. 1 according to a first embodiment. In the embodiment illustrated in FIG. 2, the thin film-inductor 170 includes a magnetic core inductor 270 integrated on top of multilevel wiring network 200.

The cross section 20 illustrates PMOS and NMOS transistor gates 162, 164 fabricated on power converter substrate 110. The multilevel wiring network 200 provides electrical connections between the PMOS and NMOS transistor gates 162, 164, the magnetic core inductor 270, and IC chip contact structures 210. The multilevel wiring network 200 is arranged into wiring planes 220. FIG. 2 depicts 4 wiring planes 220 but without limitation on any actual number of planes. Each wiring plane 220 contains wire segments 250. Electrical connections between wiring segments 250 of differing wiring planes 220 are provided by VIAs 240. IC chip contact structures 230 can be C4 contacts, solder bumps, or copper pillars, but any other contacts for the chip's external communication are acceptable without limitation. The spaces in the multilevel wiring network 200 are filled with a dielectric insulating material 260 such as $SiO_2$.

The magnetic core inductor 270 with a single planar magnetic core 180 is integrated on top of the multilevel wiring network 200. The principal plane 275 of the planar magnetic core 180 is substantially parallel with the wiring planes 220. The conductive winding 280 of the magnetic core inductor 270, forming a general spiral on the outside of the planar magnetic core 180, is piecewise constructed of wire segments 250' and of VIAs 240' that are disposed in at least two integration planes 222, which are formed on the multilevel wiring network 200. The VIAs 240' that form parts of the windings 280 are vertical to the principal plane 275 and interconnect the at least two integration planes 222.

The magnetic core 180 can include a ferromagnetic material such as Co, Ni, and/or Fe, for example $Ni_xFe_y$ or $Co_xNi_yFe_z$. In addition, or in the alternative, magnetic core 180 can include a plurality of layers. The layers can include alternating layers of ferromagnetic layers (e.g., Co, Ni, and/or Fe, an alloy of Co, Ni, and/or Fe, etc.) and non-ferromagnetic layers. For example, the non-ferromagnetic layers can be or can include an insulating material, such as the oxides of the ferromagnetic material (e.g., $Co_xO_y$, $Ni_xO_y$, and/or $Fe_xO$).

In some embodiments, an interface layer can be deposited on the insulating material layer. The interface layer can be used in the fabrication process to help deposit the next ferromagnetic layer onto the insulating material layer. The material comprising interface layer can be selected to improve adhesion and/or reduce roughness at the interface between the ferromagnetic layer and the insulating material layer. Reducing the roughness at the interface of the ferromagnetic layer and the insulating material layer can reduce coercivity for the magnetic core 180. Improving the adhesion between the ferromagnetic layer and the insulating material layer can reduce the potential for film delamination. Additionally, the interface layer can serve as a diffusion barrier or getter between the ferromagnetic layer and the insulating material layer to prevent the diffusion of material constituents from the insulating material layer to the ferromagnetic layer. Finally, the interface layer can be chosen to reduce or compensate mechanical film stress in the magnetic core 180. The interface layer can be comprised of one or more of Ta, Ti, W, Cr, or Pt, or a combination thereof, depending on the particular choice of ferromagnetic material and insulating material layer.

In some embodiments, the non-ferromagnetic layers can be or can include a current-rectifying layer. For example, the current-rectifying layers can be based on Schottky diodes. Onto the ferromagnetic layer one may electrodeposit the following sequence: a semiconducting layer—p-type with work function less than ferromagnetic layer or n-type with work function greater than ferromagnetic layer; followed by an interface metal layer—with a work function less than that of p-type semiconducting material, or greater than that of n-type semiconducting material. Then, continue with the next ferromagnetic layer, and so on. Alternatively, for rectification one may use a semiconductor p-n junction in the non-ferromagnetic layer. Any semiconductor may be suitable, one would have to choose one based on several criteria, for example without limiting, the ease of contact to the magnetic material of the p and n portions, how narrow can one make the junction, and others In some embodiments, the magnetic core inductor 270 is the same as, substantially the same as, or similar to one or more of the inductors described in U.S. patent application Ser. No. 15/391,278, U.S. Patent Application Publication No. 2014/0071636, and/or U.S. Pat. No. 9,647,053, which are hereby incorporated by reference. In some embodiments, the switched inductor DC-DC power converter chiplet 10 and cross-section 20 include a plurality of inductors, each of which can be the same or similar to inductor 170. The plurality of inductors can be arranged in parallel electrically with one another, in series electrically with one another, or a combination thereof. The plurality of inductors can be integrated on the same integration planes 222 or in different integration planes.

FIG. 3 is a cross section 30 of the switched inductor DC-DC power converter chiplet 10 illustrated in FIG. 1 according to a second embodiment. Cross section 30 is the same or substantially the same as cross section 20 except as described below. In the embodiment illustrated in FIG. 3, the thin film-inductor 170 includes a magnetic clad inductor 370 integrated on top of multilevel wiring network 200. The magnetic clad inductor 370 includes a ferromagnetic yoke 375 that surrounds a conductive winding 380. The ferromagnetic yoke 375 can include Co, Ni, and/or Fe, such as $Ni_xFe_y$, or other material as known in the art. The conductive winding 380 forms a general spiral over which the yoke 375 is disposed.

The conductive winding 380 is piecewise constructed of wire segments 250' and of VIAs 240' in at least two integration planes 222. The VIAs 240' that form parts of the windings 380 are interconnecting the at least two integration planes 222. It is noted that the wire segments 250' in the top integration plane 222 are not illustrated in FIG. 3 since they would not be visible in cross section 30.

In some embodiments, the switched inductor DC-DC power converter chiplet 10 and cross-section 30 include a plurality of inductors, each of which can be the same or similar to inductor 370. The plurality of inductors can be arranged in parallel electrically with one another, in series electrically with one another, or a combination thereof. The plurality of inductors can be integrated on the same integration planes 222 or in different integration planes 222.

FIGS. 4A and 4B are schematics of switched inductor DC-DC power converter chiplets 40A, 40B, respectively, to illustrate possible locations to integrate the thin-film inductor. In FIG. 4A, the thin-film inductor 470A is integrated on the same side of chiplet 40A as the electrical terminations 430, for example as illustrated in cross sections 20 and 30. Electrical terminations 430 can be the same as or similar to IC chip contact structures 230. In FIG. 4B, the thin-film inductor 470B is integrated on the opposite or back side of chiplet 40B with respect to the electrical terminations 430. Through-silicon VIAs 440 electrically connect the thin-film inductor 470B to the multilevel wiring network on the opposite side of chiplet 40B.

The advantage to integrating the thin-film inductor on the same side of the chiplet as the electrical terminations (e.g., as illustrated in FIGS. 2, 3, and 4A) is that the device is simpler (and less expensive) to manufacture, since it is an extension of existing back-end-of-the-line (BEOL) fabrication processes. The disadvantage to integrating the thin-film inductor on the same side of the chiplet as the electrical terminations is that the inductors and electrical terminations "compete" for space in the semiconductor design. Since the thin-film inductor (e.g., inductor 270, 370) is disposed at or near the level of the electrical contacts and their underlying VIAs (e.g., IC chip contact structures 230 and their underlying VIAs 241), the electrical contacts need to be spaced apart sufficiently to provide room for the inductor, which may increase the size of the chiplet.

The advantage to integrating the thin-film inductor on the opposite side of the chiplet with respect to the electrical terminations is that the inductors and electrical terminations no longer "compete" for space in the semiconductor design. As such, the electrical contacts and their underlying VIAs can be designed in a more compact arrangement without having to account for space for the inductor, which may decrease the size of the chiplet. The disadvantage to integrating the thin-film inductor on the opposite side of the chiplet with respect to the electrical terminations is that the device is more complex (and more expensive) to manufacture, requiring additional processing steps to form the through-silicon VIAs 440 and to fabricate the inductors on the opposite side of the chiplet as the BEOL multilevel wiring network.

Figure 5:
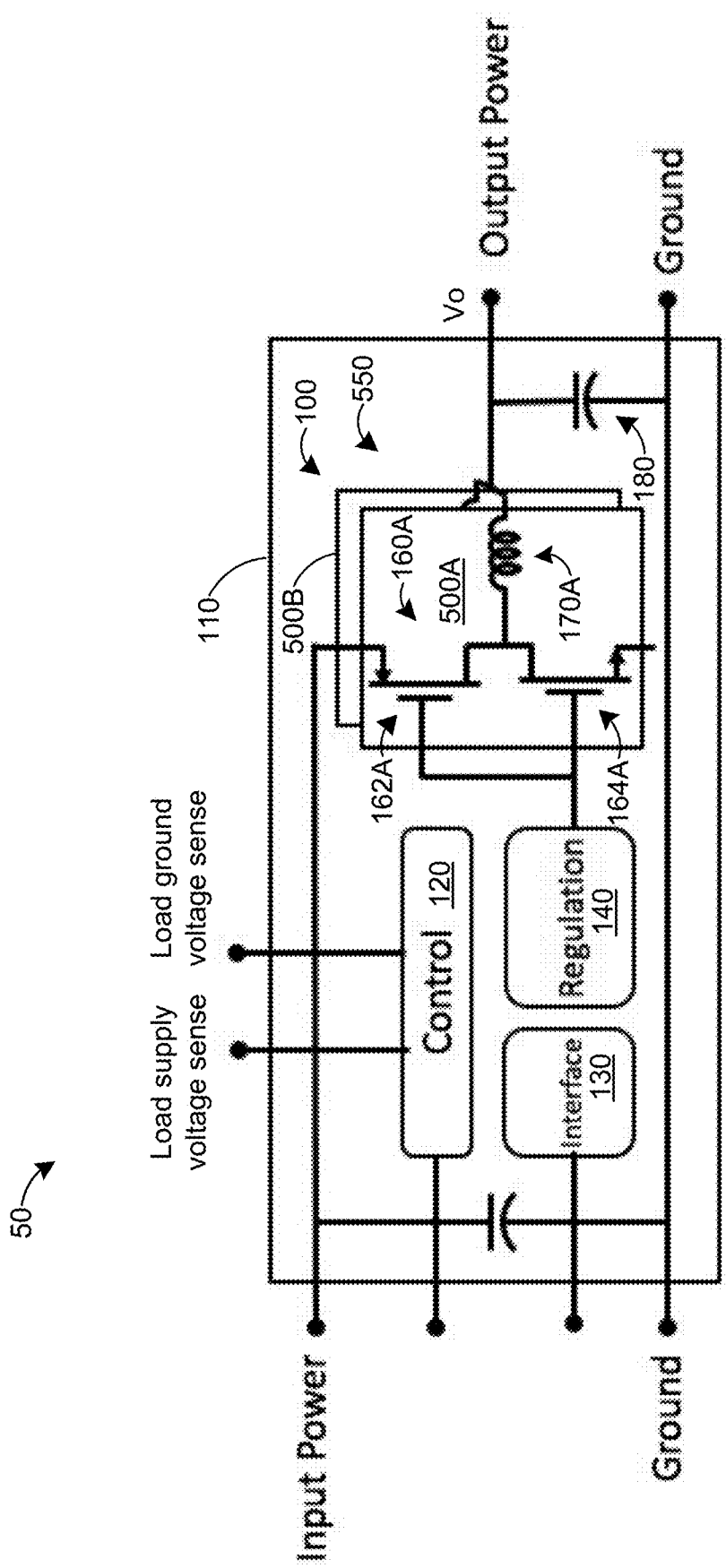
FIG. 5 is a schematic representation of a switched inductor DC-DC power converter chiplet according to one or more embodiments.

FIG. 5 is a schematic representation of a switched inductor DC-DC power converter chiplet 50 according to one or more embodiments. Switched inductor DC-DC power converter chiplet 50 is the same or substantially the same as switched inductor DC-DC power converter chiplet 10 except as described below. In contrast to DC-DC power converter chiplet 10, the powertrain 550 of DC-DC power converter chiplet 50 is divided into phases 500A, 500B (in general, phase 500N). Each phase 500N includes a separate power switch 160N and thin-film inductor 170N. For example, phase 500A includes power switch 160A and thin-film inductor 170A. Power switch 160A includes PMOS and NMOS transistor gates 162A, 164A, respectively. Similarly, phase 500B is identical to phase 500A and thus includes its own power switch 160B and thin-film inductor 170B (not illustrated in FIG. 5). Switched inductor DC-DC power converter chiplet 50 can include additional phases 500N as desired. Each phase 500N is electrically in parallel with the other phases 500N. A common output terminal electrically couples the output of each phase 500N to the output power line. A common input terminal electrically couples the input of each phase 500N to the input power line.

The control circuitry 120 can vary the number of phases 500N that are electrically connected to the load current to improve power conversion efficiency. The control circuitry 120 can monitor the load current by measuring the DC (average) voltage drop across the inductor(s) and dividing by the resistance the inductor(s) (a known quantity that is part of the converter design). Typically, a difference amplifier that taps the bridge node (between the PMOS and NMOS transistor gates 162A, 164A) and Vout, is used to measure this voltage. Once the current has been measured, this value can be digitized and sent to a state machine that has programmed thresholds (e.g., similar to the "steps" in FIG. 6) for the number of phases to have on for a given load current. Phases can be physically activated/deactivated by turning on/off the power train logic driving the bridge FETs (e.g., PMOS and NMOS transistor gates 162A, 164A) through a digital logic operation. For example, the driving signal for the bridge node can be combined with an ENABLE bit for each phase by an AND operation.

Figure 6:
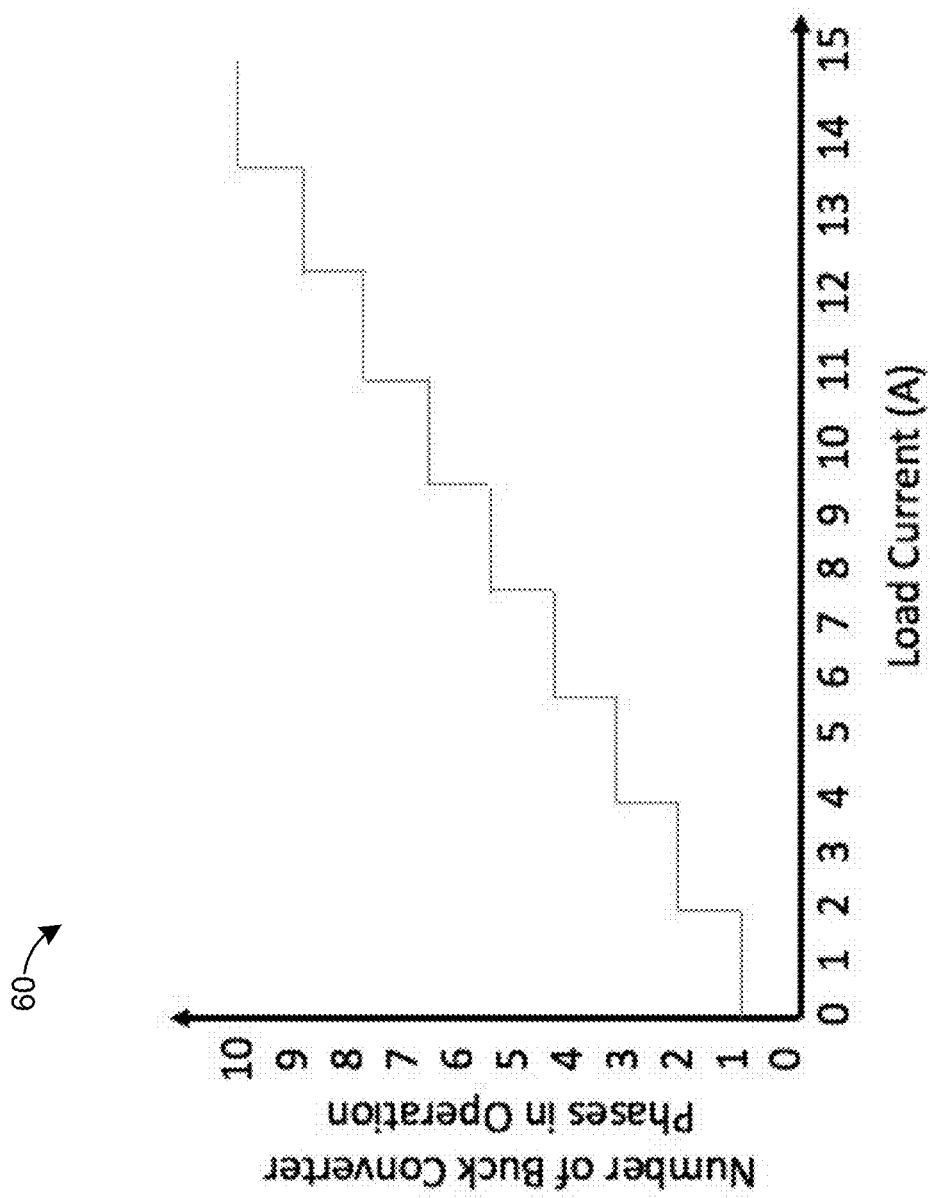
FIG. 6 is a graph that illustrates an example of the relationship between the number of phases in operation and the load current.
Figure 7A:
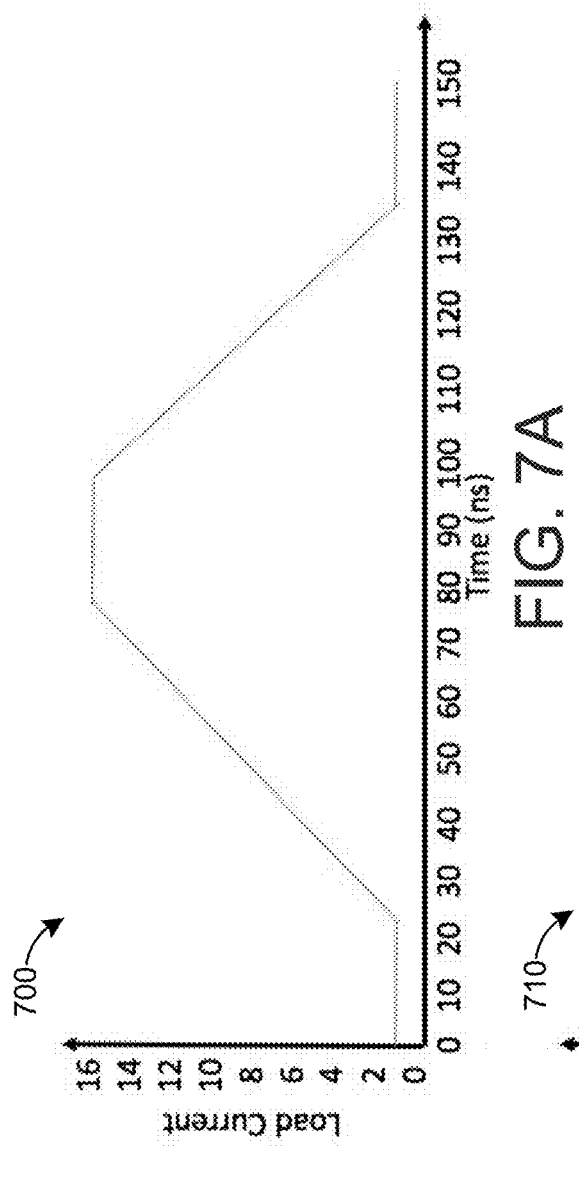
FIG. 7A is a graph that illustrates an example of a time-domain representation of how the control circuitry can vary the number of phases according to load current variation.
Figure 7B:
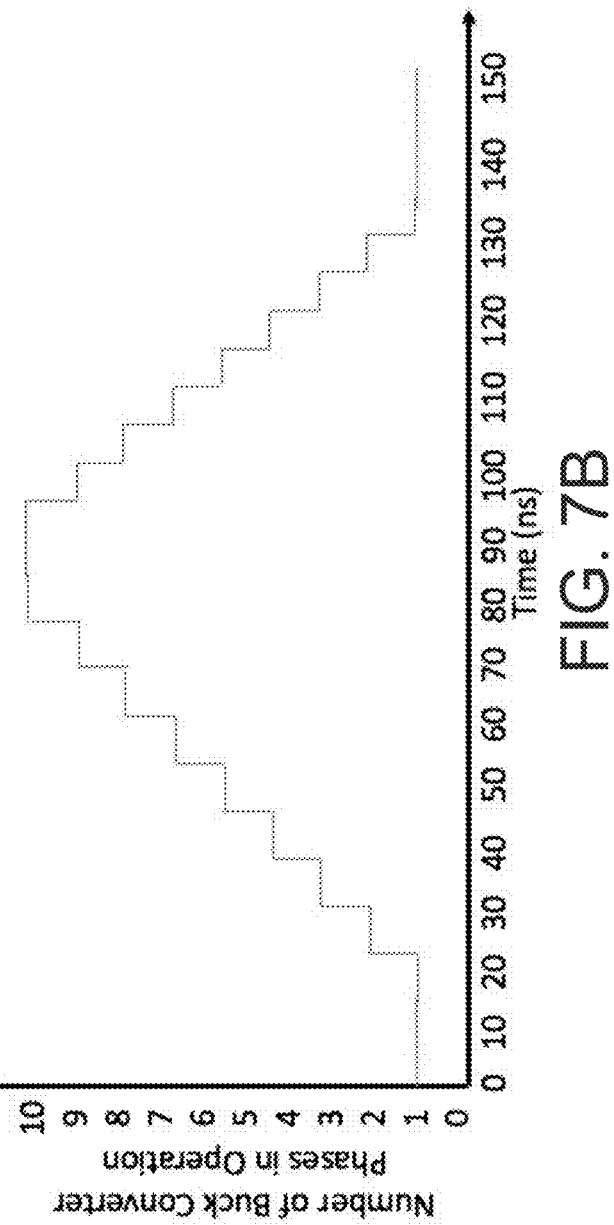
FIG. 7B is another graph that illustrates an example of a time-domain representation of how the control circuitry can vary the number of phases according to load current variation.

An example of the relationship between the number of phases 500N in operation and the load current is illustrated in graph 60 in FIG. 6. An example of a time-domain representation of how the control circuitry 120 can vary the number of phases 500N by turning them on and off according to the load current variation is illustrated in graphs 700 and 710 in FIGS. 7A and 7B, respectively. The phases 500N can be turned on or off very quickly (e.g., response time less than 10 ns), which allows the control circuitry 120 to improve high-frequency (e.g., greater than 10 MHz) supply voltage regulation.

Figure 8:
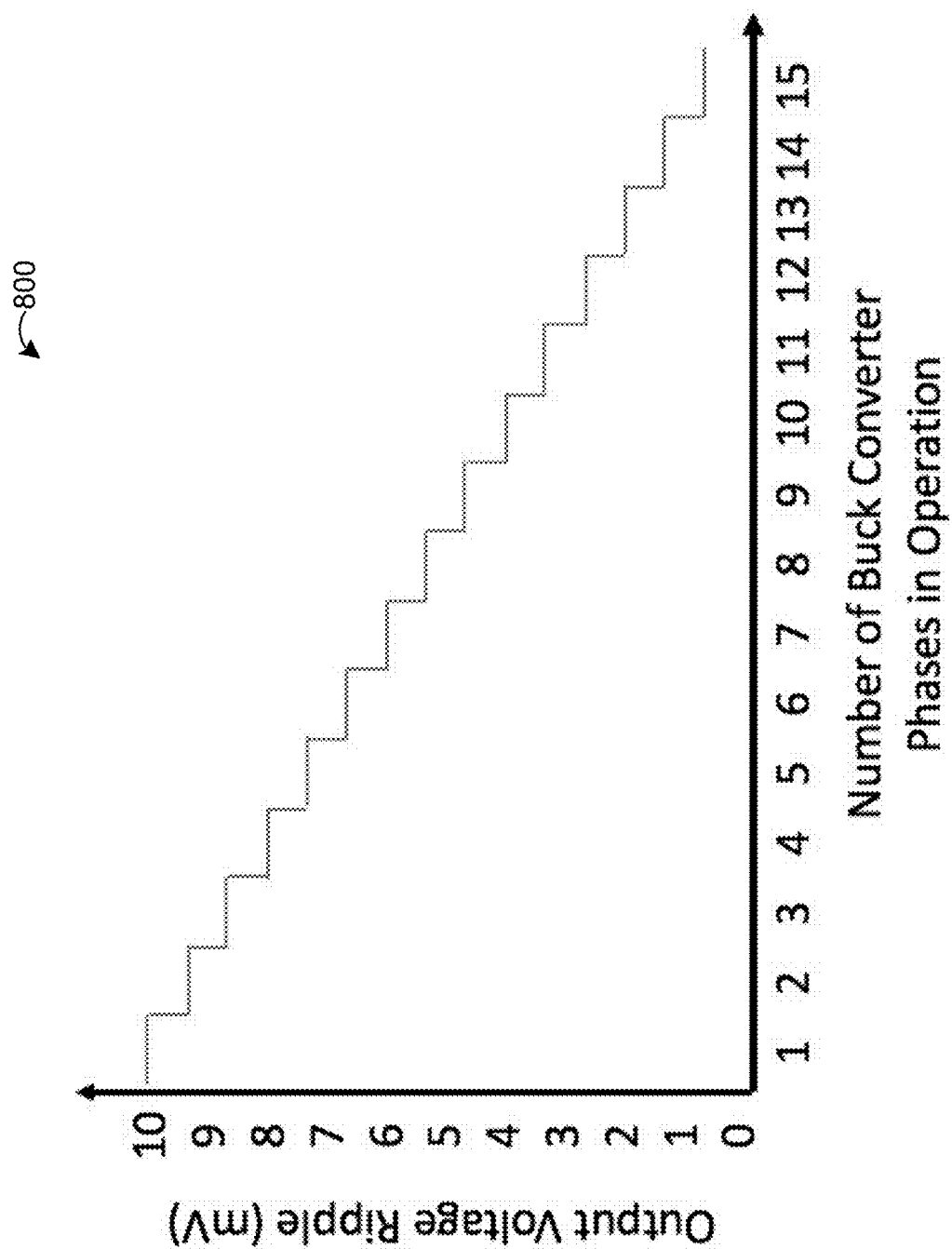
FIG. 8 is a graph that illustrates an example of how relative phase offsets can reduce the output voltage ripple as a function of the number of phases in operation.

In some embodiments, the control circuitry 120 can operate the phases 500N in a phase-interleaved manner so that deconstructive interference occurs (e.g., due to an offset in the relative phase of the current that passes through phases 500N) at the switching frequency to reduce the output voltage ripple. An example graph 800 of the reduction in the output voltage ripple as a function of the number of phases 500N in operation is illustrated in FIG. 8.

Figure 9:
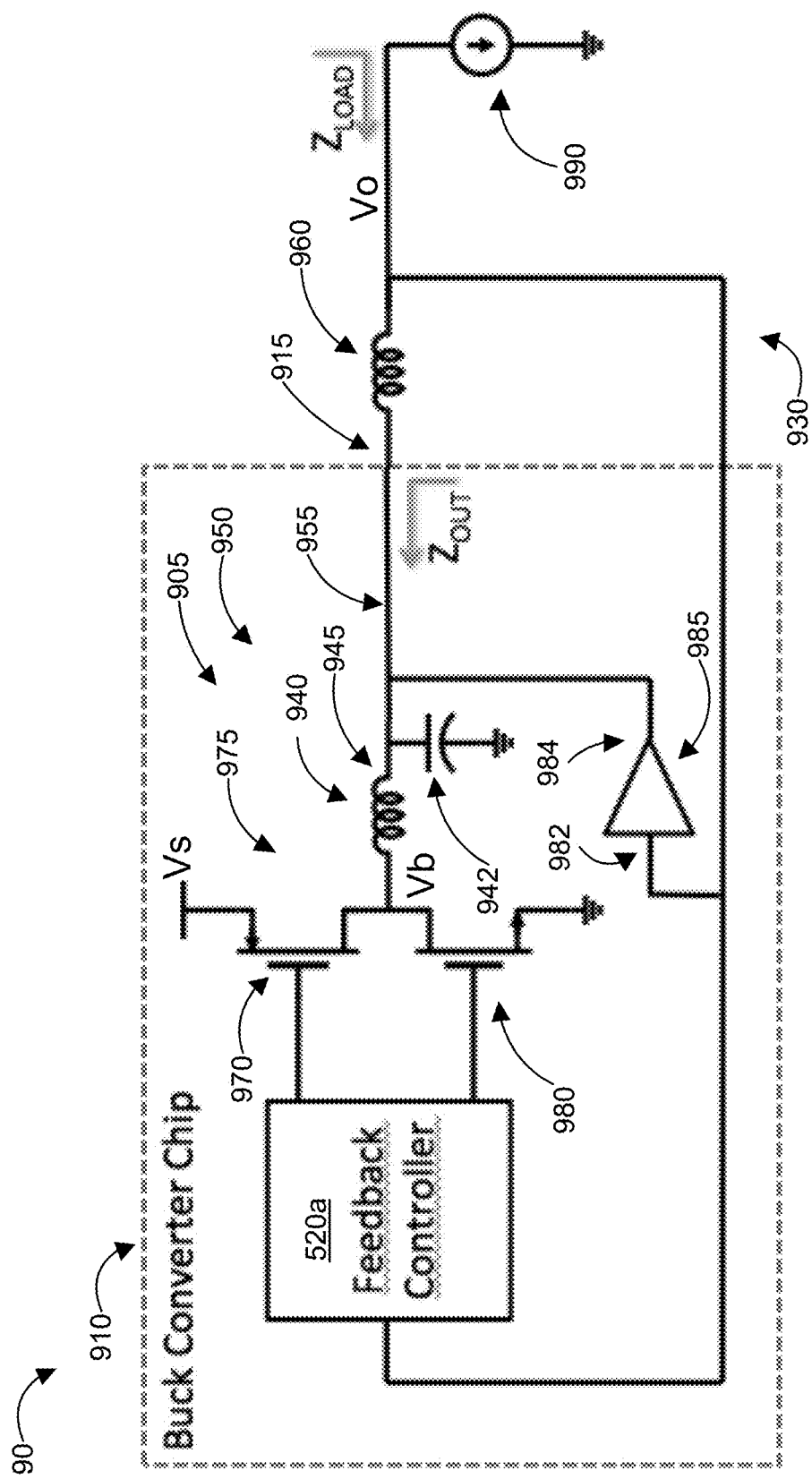
FIG. 9 illustrates a schematic view of an exemplary power converter with voltage sensing feedback loop and linear control element according to one or more embodiments.

FIG. 9 illustrates a schematic view of an exemplary power conversion system 90 with voltage sensing feedback loop 930 and linear control element 980, according to an embodiment. Buck converter chip 910 comprises feedback controller 920, CMOS PWM signal generator 975 (comprised of a CMOS device), series inductor 940, shunt capacitor 942, feedback loop 930 and linear control element 985. As discussed above, series inductor 940 and shunt capacitor 942 form a low-pass filter 955 assuming a resistive load thereto. A switched inductor power converter 905 is formed by the feedback controller 920, CMOS PWM signal generator 975, and the low-pass filter (series inductor 940 and shunt capacitor 942). The switched inductor power converter 905 includes a powertrain 950 that can include a plurality of phases, such as phases 500N discussed above.

CMOS PWM signal generator 975 comprises PMOS 970 and NMOS 980 transistors to produce a periodic rectangular wave with a predetermined frequency (e.g., a PWM signal) as previously described. Feedback controller 920 compensates for high current loads 90 and variations in input power (Vs) by monitoring output voltage (Vo) proximal to the load 90 via voltage sensing loop 930. The feedback controller 920 calculates a voltage error, which is the difference between the actual output voltage Vo and a target output voltage. The target output voltage can be set manually or pre-programmed based on the specifications of the load 90. If there is a positive voltage error (i.e., the actual output voltage Vo is greater than the target output voltage), the feedback controller 920 responds by decreasing the duty cycle of the PWM signal generated by CMOS PWM signal generator 975. If there is a negative voltage error (i.e., the actual output voltage Vo is less than the target output voltage), the feedback controller 920 responds by increasing the duty cycle of the PWM signal generated by CMOS PWM signal generator 975. The switched inductor power converter 905 is configured to respond to low frequency variations in voltage error (e.g., less than the LC resonance frequency of the output low-pass filter). Frequencies higher than the LC resonance frequency cannot pass through the series inductor 940.

Thus, the feedback controller 920 modulates the duty cycle of the PWM signal to create a constant (or substantially constant) actual output voltage Vo. In some embodiments, the feedback controller 920 modulates the duty cycle of the PWM signal using a PID (proportional-integral-differential), PI, or PD controller. The output of the low-pass filter also remains relatively constant which is the average value of the switching signal which is equal to the voltage of the input power supply (Vs) multiplied by the duty cycle of the PWM signal.

The PWM signal drives current though series inductor 940 at the bridge voltage (Vb). The second terminal 945 of series inductor 940 is wired to output power to delivery line 955 and shunt capacitor 942 in parallel. The fundamental frequency of the PWM signal is configured to be higher than the LC resonance of the output low-pass filter, which is determined by series inductor 940 and shunt capacitor 942 and parasitic inductance 960.

Series resistance in the series inductor 940, shunt capacitor 942, and switches 970, 980 of the CMOS PWM signal generator 975 all result in loss. Similarly, a parasitic inductance 960 occurs along the delivery line 955 (e.g., circuit trace elements) from the buck converter chip 910 output 915 to the load 90 which also detrimentally affects the functionality of the power conversion system 90.

The efficacy of load regulation by the feedback controller 920 is diminished due to the parasitic capacitances, parasitic inductance 960 and inherent resistivity in the circuit elements. In one configuration, a separate linear control element 985 is added to the buck converter chip 910. The input 982 of the linear control element 985 monitors the output voltage Vo from the feedback loop/voltage sensing path 930. The output 984 of the linear control element 985 contributes to the regulation of the output voltage Vo by responding to high frequency variations (e.g., greater than the LC resonance frequency of the output low pass filter) in the output voltage Vo as discussed below.

In some embodiments, linear control element 985 is a low-dropout (LDO) regulator. Yet, any suitable DC voltage regulator is not beyond the scope of the present invention. A low-dropout or LDO regulator is a DC linear voltage regulator that can operate with a very small input-output differential voltage. In the configuration illustrated in FIG. 9, the effectiveness of the linear control element 985 is somewhat limited because the linear controller element 985 is still filtered by the shunt capacitor 942 and parasitic inductance 960.

In some embodiments, the load current can vary, which may cause an error or deviation in the output voltage Vo. A "load-line" can be applied which varies the target output voltage according to the load current in order to reduce the maximum possible supply voltage variation over load current.

Figure 10:
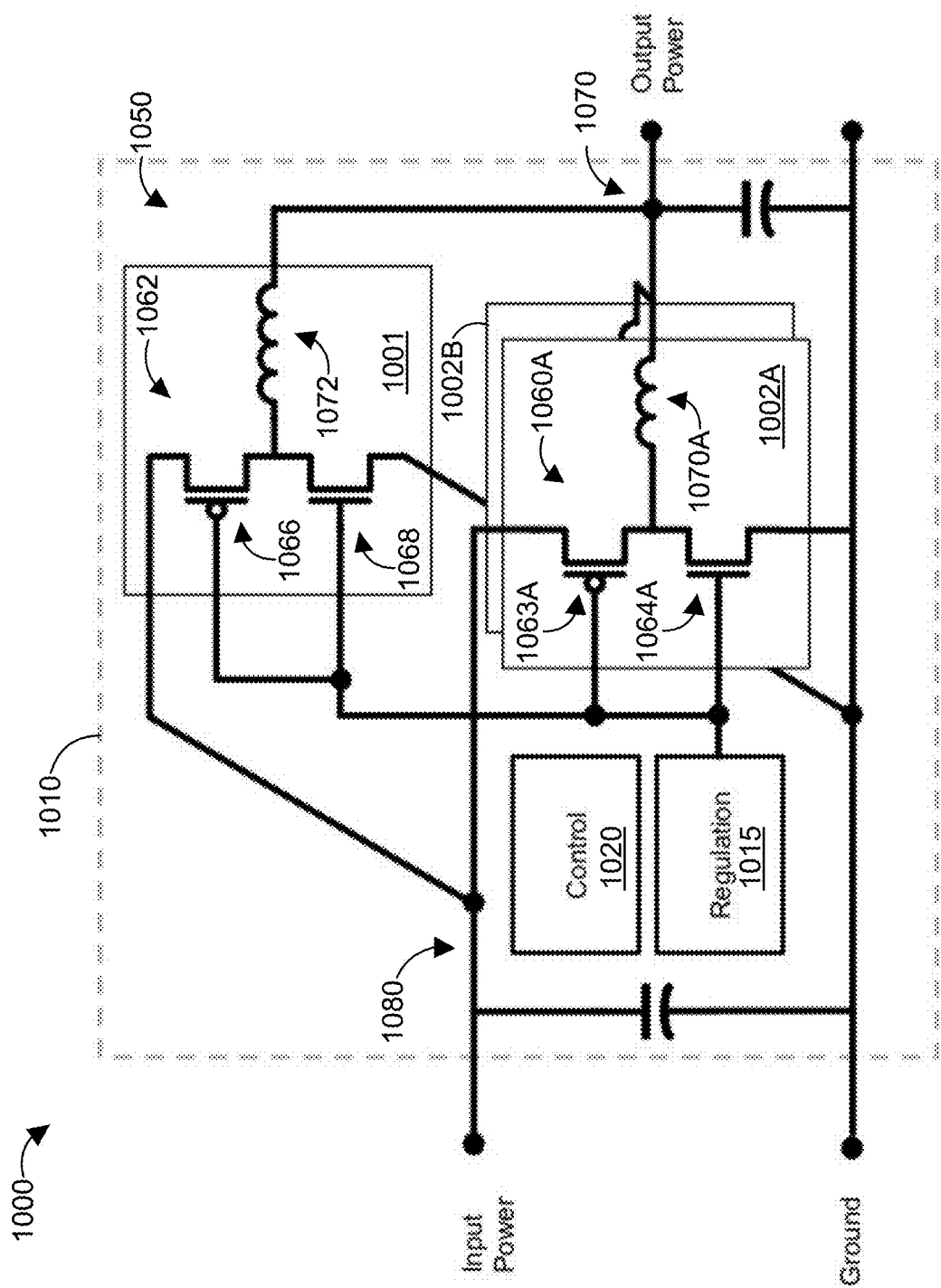
FIG. 10 is a schematic representation of a switched inductor DC-DC power converter chiplet according to one or more alternative embodiments.

FIG. 10 is a schematic representation of a switched inductor DC-DC power converter chiplet 1000 according to one or more alternative embodiments. Switched inductor DC-DC power converter chiplet 1000 is the same or substantially the same as switched inductor DC-DC power converter chiplet 50 except as described below. In contrast to DC-DC power converter chiplet 50, the powertrain 1050 of DC-DC power converter chiplet 1000 is divided into a first powertrain phase 1001 and second powertrain phases 1002A, 1002B (in general, second powertrain phases 1002N). The first powertrain phase 1001 includes a power switch 1062 and a thin-film inductor 1072. Power switch 1062 includes PMOS and NMOS transistor gates 1066, 1068, respectively.

Each second powertrain phase 1002N includes a separate power switch 1060N and thin-film inductor 1070N. For example, second powertrain phase 1002A includes power switch 1060A and thin-film inductor 1070A. Power switch 1060A includes PMOS and NMOS transistor gates 1063A, 1064A, respectively. Second powertrain phase 1002B is identical to second powertrain phase 1002A and thus includes its own power switch 1060B and thin-film inductor 1070B (not illustrated in FIG. 10). Switched inductor DC-DC power converter chiplet 1000 can include additional second powertrain phases 1002N as desired. Each second powertrain phase 1002N is in parallel electrically with the other phases 1002N.

A common output terminal 1070 electrically couples the output of the first powertrain phase 1001 and each second powertrain phase 1002N to the output power line. A common input line 1080 electrically couples the input of the first powertrain phase 1001 and each second powertrain phase 1002N.

The DC-DC power converter chiplet 1000 includes control circuitry 1020 that can turn on or off any of the first powertrain phase 1001 and/or any second powertrain phase 1002N that are electrically connected to the load current (e.g., to the output power line) to improve the power conversion efficiency, which can vary as a function of the load current. The power conversion efficiency of a DC-DC power converter chiplet, such as DC-DC power converter chiplet 1000 is calculated as the ratio of the output power to the input power. In other words, $$\eta_{chiplet} = \frac{P_{out}}{P_{in}}.$$

The power conversion efficiency of any phase is determined in the same way, $$\eta_{phase} = \frac{P_{out\_phase}}{P_{in\_phase}}.$$

The first powertrain phase 1001 has a maximum power conversion efficiency at a first load current, and each second powertrain phase 1002N has a maximum power conversion efficiency at a second load current. The first and second load currents can be different. For example, the first load current can be lower than the second load current. In a specific example, the first powertrain phase 1001 can have a maximum power conversion efficiency when the load current is about 1 mA to about 1 A, including about 250 mA, about 500 mA, about 750 mA, and any load current or load current range between any two of the foregoing load currents, and each second powertrain phase 1002N can have a maximum power conversion efficiency when the load current is about 100 mA to about 5 A, including about 500 mA, about 1 A, about 1.5 A, about 2 A, about 2.5 A, about 3 A, about 3.5 A, about 4 A, about 4.5 A, and any load current or load current range between any two of the foregoing load currents.

In some embodiments, the control circuitry 1020 can operate the second powertrain phases 1002N in a phase-interleaved manner so that deconstructive interference occurs (e.g., due to an offset in the relative phase of the current that passes through phases 1002N) at the switching frequency to reduce the output voltage ripple, for example as described above with respect to phases 500N. The control circuitry 1020 generates a PWM signal and regulation circuitry 1015 is configured to open and close the PMOS and NMOS transistor gates of each power switch (e.g., PMOS and NMOS transistor gates 1063N, 1064N of power switch 1060N, and PMOS and NMOS transistor gates 1066, 1068 of power switch 1062) according to the PWM signal generated by control circuitry 1020.

The control circuitry 1020 can turn on and off the first and second powertrain phases 1001, 1002N very quickly (e.g., response time less than 10 ns), which allows the control circuitry 1020 to improve high-frequency (e.g., greater than 10 MHz) supply voltage regulation. The foregoing structure of DC-DC power converter chiplet 1000 is formed or fabricated on a common power converter substrate 1010, such as a silicon substrate.

Figure 11:
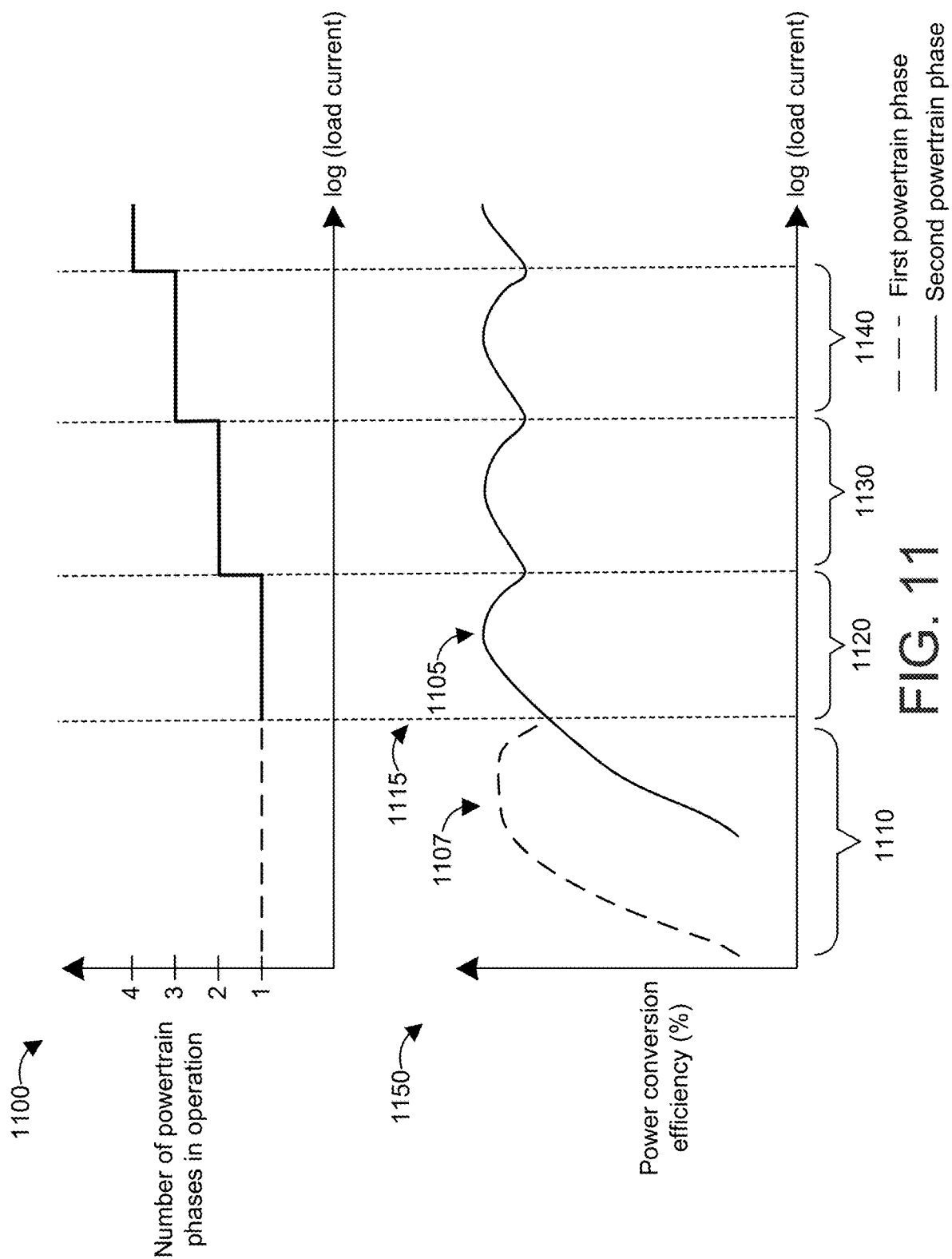
FIG. 11 illustrates an example of the relationship between the number of first and second powertrain phases in operation and the load current and an example of the relationship between the power conversion efficiency and the load current in graph.

FIG. 11 illustrates an example of the relationship between the number of first and second powertrain phases 1001, 1002N in operation and the load current in graph 1100 and an example of the relationship between the power conversion efficiency and the load current in graph 1150. As can be seen, when 1 second powertrain phase (e.g., second powertrain phase 1002A) is in operation, the second powertrain phase 1002A has a relatively low power conversion efficiency in region 1110 and a relatively high power conversion efficiency, including a second maximum power conversion efficiency 1105 at a second load current, in region 1120. The second maximum power conversion efficiency 1107 can be about 100 mA to about 5 A, including about 500 mA, about 1 A, about 1.5 A, about 2 A, about 2.5 A, about 3 A, about 3.5 A, about 4 A, about 4.5 A, and any load current or load current range between any two of the foregoing load currents. In some embodiments, the second maximum power conversion efficiency 1107 is optimized to minimize the nulls in the power conversion efficiency curve (e.g., from dropping too low) for the second powertrain phases 1002N over the full load current range of the chip.

In contrast, when the first powertrain phase 1001 is in operation, the first powertrain phase 1001 has a relatively high power conversion efficiency in region 1110, including a first maximum power conversion efficiency 1107 at a first load current in region 1110, and a relatively low power conversion efficiency in region 1120. The first maximum power conversion efficiency 1107 can be about 10 mA to about 1 A, including about 50 mA, about 100 mA, about 200 mA, about 300 mA, about 400 mA, about 500 mA, about 600 mA, about 700 mA, about 800 mA, about 900 mA, and any load current or load current range between any two of the foregoing load currents.

Thus to improve power conversion efficiency at low load currents, the controller (e.g., control circuitry 1020) turns on the first powertrain phase 1001 and turns off all second powertrain phases 1002N when the load current is in region 1110. When the load current increases to region 1120, the controller turns off the first powertrain phase 1001 and turns on 1 of the second powertrain phases 1002N (e.g., second powertrain phase 1002A). The transition from region 1110 to region 1120 can be defined by a threshold load current 1115. The threshold load current 1115 can be about 10 mA to about 1 A, including about 100 mA, about 200 mA, about 300 mA, about 400 mA, about 500 mA, about 600 mA, about 700 mA, about 800 mA, about 900 mA, and any load current or load current range between any two of the foregoing load currents. The threshold load current 1115 can be determined based on the point where the power conversion efficiency curve for the second powertrain phase 1002A overlaps the power conversion efficiency curve for the first powertrain phase 1001, so as to maximize the operating efficiency over the entire load current range.

To maximize the power conversion efficiency when the load current is less than or equal to the threshold load current 1115 (e.g., in region 1110), the controller turns on the first powertrain phase 1001 and turns off all second powertrain phases 1002N. To maximize the power conversion efficiency when the load current is higher than the threshold load current 1115, the controller turns off the first powertrain phase 1001 and turns on one of the second powertrain phases 1002N, such as second powertrain phase 1002A.

As each second powertrain phases 1002N is identical, the maximum power conversion efficiency 1105 of each second powertrain phase 1002N occurs at the second load current. The maximum power conversion efficiency 1105 of multiple (M) second powertrain phases 1002N operating in parallel occurs at a multiple M of the second load current. For example, when the maximum power conversion efficiency 1105 of 1 second powertrain phase 1002N occurs at a 1 A load current, the maximum power conversion efficiency 1105 of 2 second powertrain phases 1002N occurs at a 2 amp load current, and so on.

As the load current increases to regions 1130 and 1140, the controller turns on 2 and 3 second powertrain phases 1002N, respectively. Regions 1130 and 1140 can be at least 2× higher and at least 3× higher, respectively, than the second load current where the maximum power conversion efficiency 1105 of each second powertrain phase 1002N occurs. Thus the controller can transition between second powertrain phases 1002N when the load current is at a multiple of the second load current where the maximum power conversion efficiency 1105 of each second powertrain phase 1002N occurs, or when the second load current is greater than (e.g., slightly greater than such as about 5% to about 10% greater than) the load current where the maximum power conversion efficiency 1105 of each second powertrain phase 1002N occurs.

Figure 12:
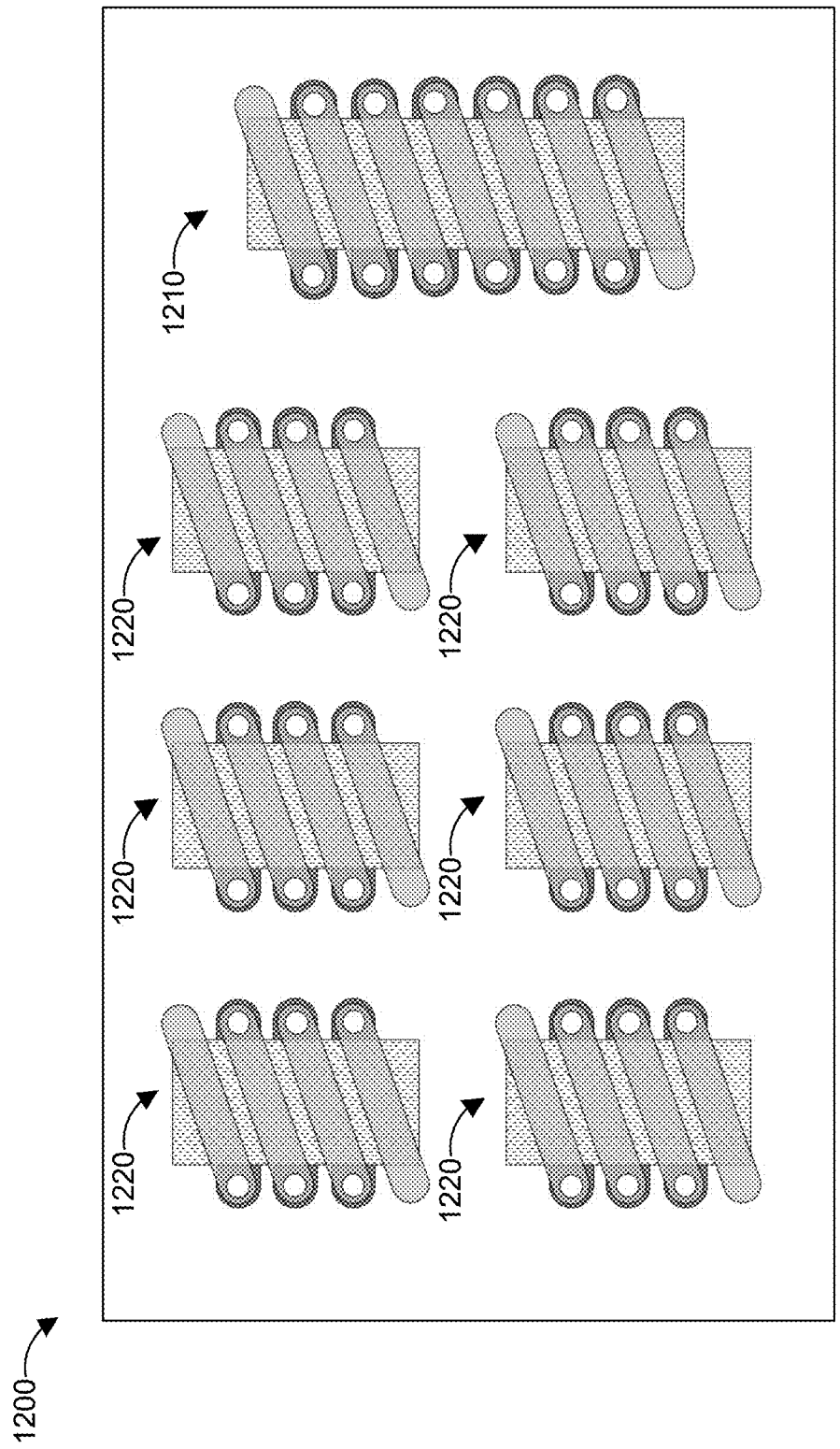
FIG. 12 is a top-down view of a schematic representation of a switched inductor DC-DC power converter chiplet having a side-by-side layout according to one or more embodiments.

FIG. 12 is a top-down view of a schematic representation of a switched inductor DC-DC power converter chiplet 1200 having a side-by-side layout according to one or more embodiments. The chiplet 1200 includes a first solenoid inductor 1210 for the first powertrain phase (e.g., first powertrain phase 1001) and second solenoid inductors 1220 for each second powertrain phase (e.g., second powertrain phases 1002N). In FIG. 12, there are 6 second solenoid conductors 1220 illustrated for 6 corresponding second powertrain phases. However, there can be additional or fewer second solenoid inductors 1220 in other embodiments. Each solenoid inductor 1210, 1220 is electrically coupled to a respective power switch that includes PMOS and NMOS transistor gates. The solenoid coils for each inductor 1210, 1220 are formed on the same upper and lower metal layers, which are electrically connected by conductive VIAs. In other words, the inductors 1210, 1220 are formed in the same integration layers (e.g., the same first and second integration layers). In some embodiments, the inductors 1210, 1220 have the same or substantially the same structure as inductor 270, described above, however the first solenoid inductor 1210 can be physically larger than the second solenoid inductors 1220. In each phase 1001, 1002N, AC and DC current flows through respective solenoid inductors 1210, 1220. For a given inductor design, as load current decreases, the DC portion decreases, but the AC portion remains the same. Inductors that are physically larger (e.g., first solenoid inductor 1210) have larger inductances that reduce the value of this AC ripple, so they generally have higher peak efficiencies at lower loads.

Figure 13:
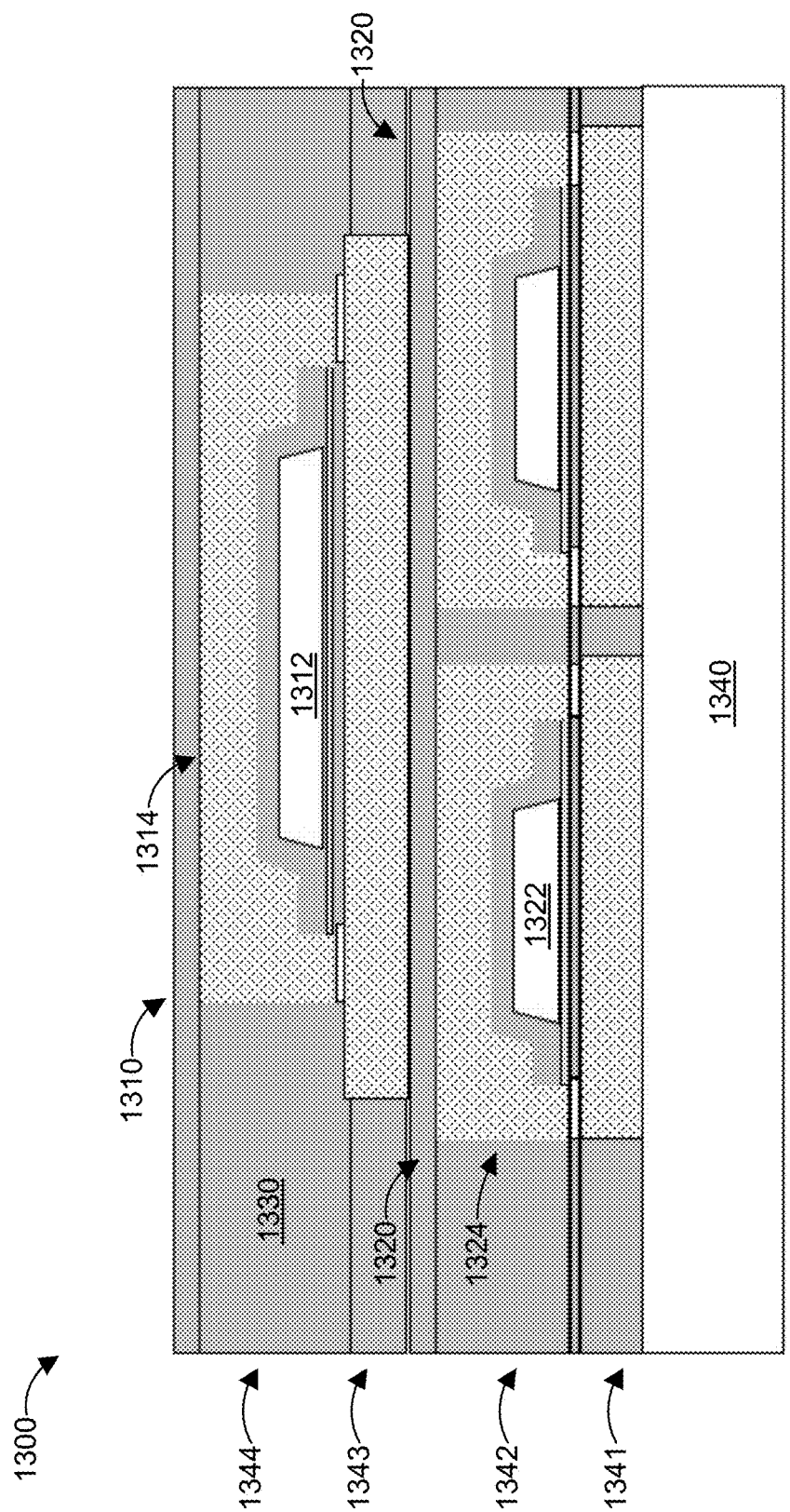
FIG. 13 is a cross-sectional view of a switched inductor DC-DC power converter chiplet having a stacked layout according to one or more embodiments.

FIG. 13 is a cross-sectional view of a switched inductor DC-DC power converter chiplet 1300 having a stacked layout according to one or more embodiments. The chiplet 1300 includes a first solenoid inductor 1310 for the first powertrain phase (e.g., first powertrain phase 1001) and second solenoid inductors 1320 for each second powertrain phase (e.g., second powertrain phases 1002N). The first solenoid inductor 1310 is disposed above the second inductors 1320 on a different integration level. The first solenoid inductor 1310 includes a ferromagnetic core 1312 and a conductive solenoid winding 1314 that wraps around the ferromagnetic core 1312 in a spiral manner. Each second solenoid inductor 1320 includes a ferromagnetic core 1322 and a conductive solenoid winding 1324 that wraps around the ferromagnetic core 1322 in a spiral manner. The conductive solenoid windings 1314, 1324 are formed on upper and lower metal layers that are electrically connected by conductive VIAs.

Passivation layers 1330 are disposed around each conductive winding 1314, 1324, and between each conductive winding 1314, 1324 and the respective ferromagnetic core 1312, 1322. Each inductor 1310, 1320 can be the same as or substantially the same as inductor 270 described above. In addition, each inductor 1310, 1320 is electrically coupled to a respective power switch that includes PMOS and NMOS transistor gates formed in substrate 1340. In other embodiments, the power switch could be formed of other transistors such as gallium nitride power FETs driving inductor chiplets (e.g., integrated passive devices). These elements could be packaged together with a separate CMOS die for the control circuits. This approach would not be monolithic, but it could address input voltages and load currents that are not addressable with standard CMOS.

Each second solenoid inductor 1320 is integrated in first and second integration layers 1341, 1342. For example, the conductive solenoid winding 1324 of each second solenoid inductor 1320 includes a first metal layer formed in the first integration layer 1341 and a second metal layer formed in the second integration layer 1342, and a conductive VIA electrically connects the first and second metal layers. The first solenoid inductor 1310 is integrated in third and fourth integration layers 1343, 1344. For example, the conductive solenoid winding 1314 of the first solenoid inductor 1310 includes a first metal layer formed in the third integration layer 1343 and a second metal layer formed in the second integration layer 1344, and a conductive VIA electrically connects the first and second metal layers. The first and second integration layers 1341, 1342 are disposed closer to the substrate than the third and fourth integration layers 1343, 1344.

In other embodiments, the second solenoid inductors 1320 can be integrated in the third and fourth integration layers 1343, 1344 and the first solenoid inductor 1310 can be integrated in the first and second integration layers 1341, 1342. In yet other embodiments, the first solenoid inductor 1310 is integrated in third and fourth integration layers 1343, 1344, one or more second solenoid inductor(s) 1320 is/are integrated in the first and second integration layers 1341,

1342, and one or more second solenoid inductor(s) 1320 is/are integrated in the third and fourth integration layers 1343, 1344.

Figure 14:
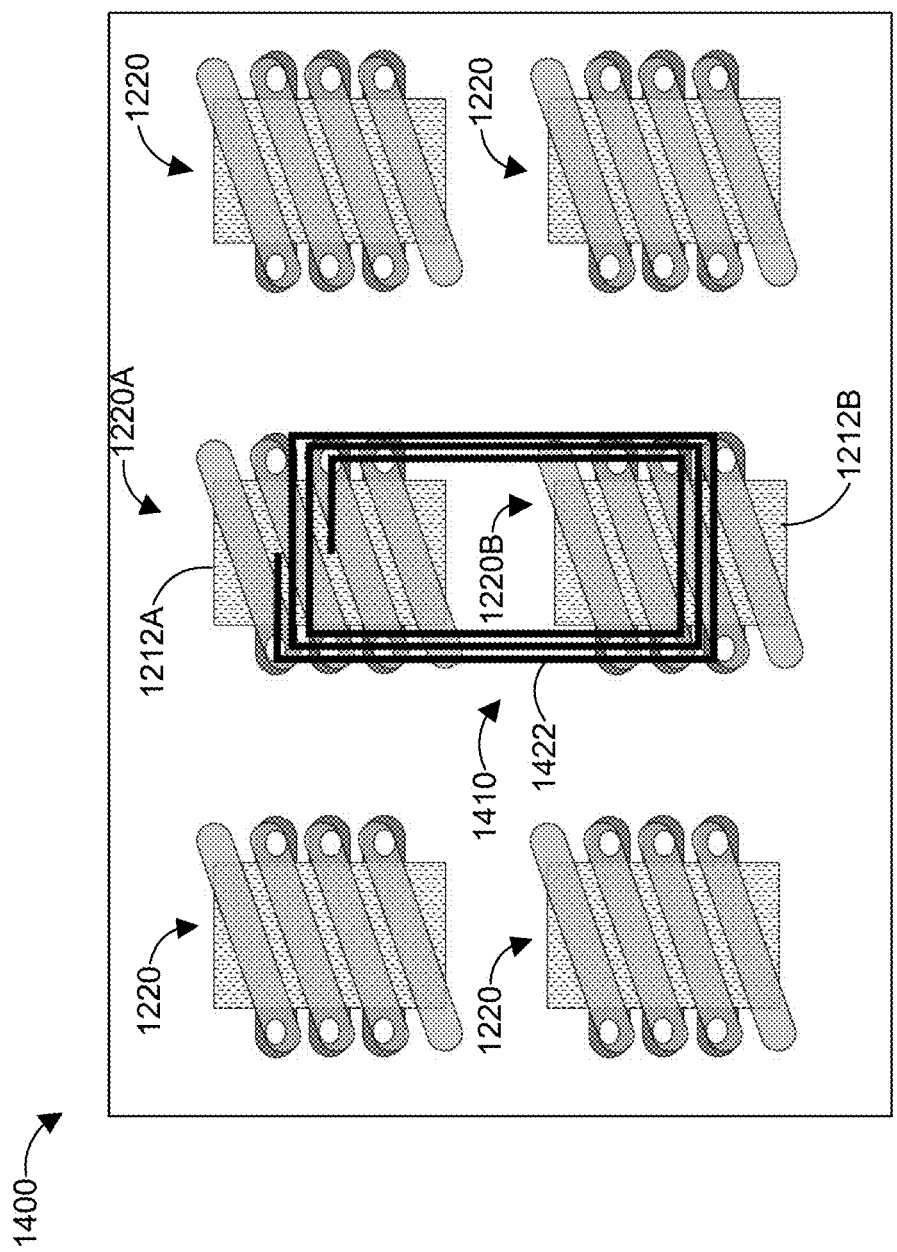
FIG. 14 is a top-down view of a schematic representation of a switched inductor DC-DC power converter chiplet according to one or more embodiments.

FIG. 14 is a top-down view of a schematic representation of a switched inductor DC-DC power converter chiplet 1400 according to one or more embodiments. The chiplet 1400 includes a first spiral inductor 1410 for the first powertrain phase (e.g., first powertrain phase 1001) and second solenoid inductors 1220 for each second powertrain phase (e.g., second powertrain phases 1002N). The first spiral inductor 1410 can include a planar spiral coil 1422 that is formed in a metal layer disposed below the lower metal layer used by the solenoid coils for second solenoid inductors 1220. For example, in FIG. 13, the first spiral inductor 1410 could be formed in integration layer 1342, beneath the layers for the spiral inductor 1310. A portion of the magnetic cores 1212A, 1212B of neighboring second solenoid inductors 1220A, 1220B, respectively, are shared with the first spiral inductor 1410. Alternatively, the planar spiral coil 1422 can be formed in a metal layer disposed above the upper metal layer used by the solenoid coils for second solenoid inductors 1220. For example, in FIG. 13, the first spiral inductor 1410 could be formed above integration layer 1344, above the layers for the spiral inductor 1310.

Figure 15:
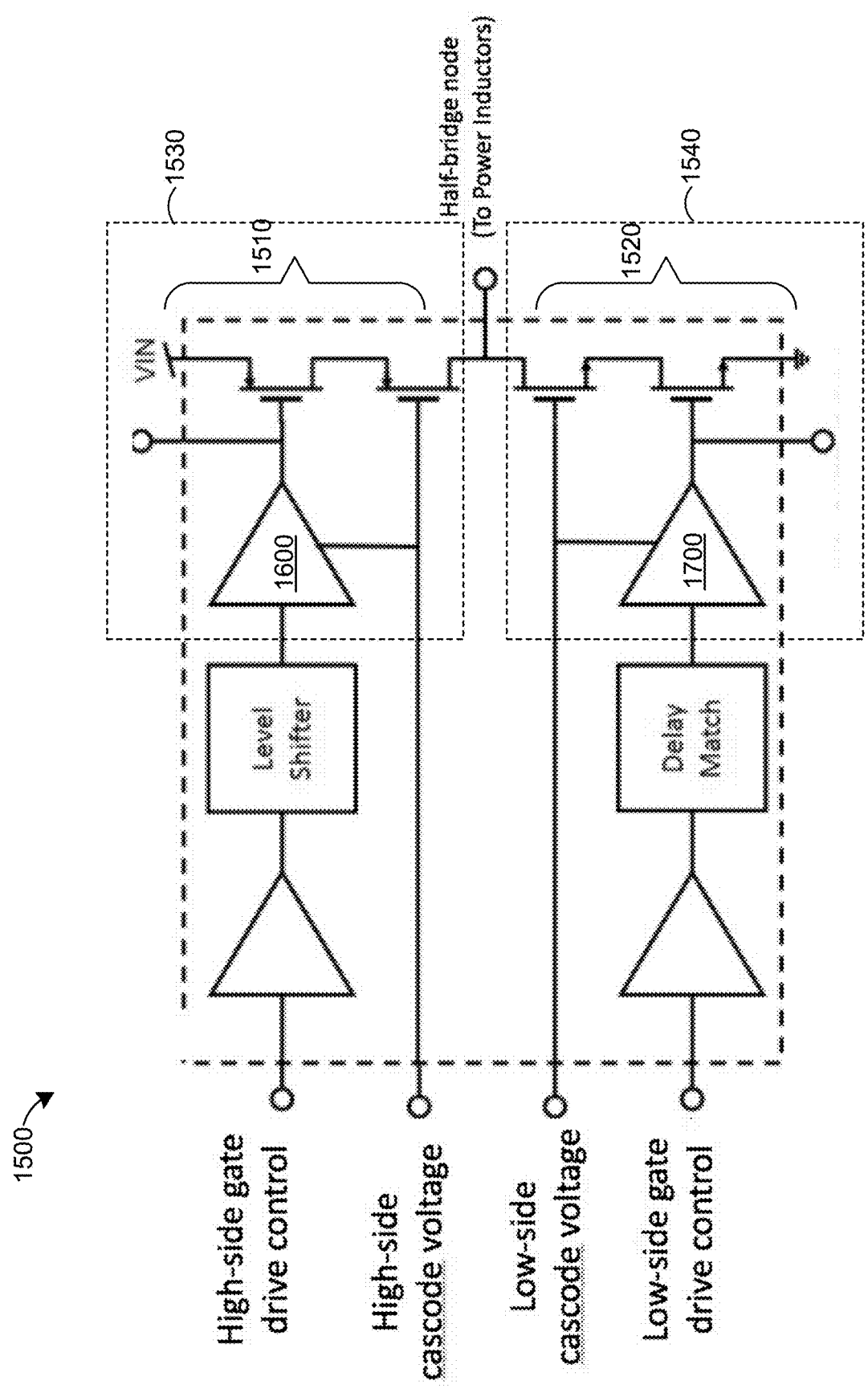
FIG. 15 is a schematic representation of a power switch that can be used in the switched inductor DC-DC power converter chiplets described above according to one or more embodiments.

FIG. 15 is a schematic representation of a power switch 1500 that can be used in the switched inductor DC-DC power converter chiplets described above according to one or more embodiments. For example, power switch 160 in switched inductor DC-DC power converter chiplets 10 and/or 50 can be the same as power switch 1500. In addition, CMOS PWM signal generator 975 in switched power conversion system 90 can be the same power switch 1500. In another example, power switches 1062, 1060N in switched inductor DC-DC power converter chiplet 1000 can be the same as power switch 1500.

Power switch 1500 includes high-side switches 1510 and low-side or NMOS switches 1520. The high-side switches 1510 and low-side switches 1520 each include two switches that are in series electrically with one another in a cascode configuration. The cascode configuration allows the power switch 1500 to include "thin-gate oxide" transistors used in current CMOS manufacturing (e.g., in 180 nm, 130 nm, 90 nm, 45 nm, 40 nm, 28 nm, 16 nm, 10 nm, and/or 7 nm technology nodes) but with higher voltage levels than the regular maximum voltage level for such transistors. For example, including two thin-gate oxide transistors that are in series electrically with one another can sustain twice the standard or typical maximum voltage level compared to a single thin-gate oxide transistor. In addition, the thin-gate oxide transistors only require a small gate charge ($Q_{on}$) to actuate the power switched and they have a small power switch resistance ($R_{on}$) (i.e., the resistance of the switch when it forms a closed circuit). Thus, the performance of the thin-gate oxide transistors in a cascode configuration can provide improved overall performance.

Figure 16:
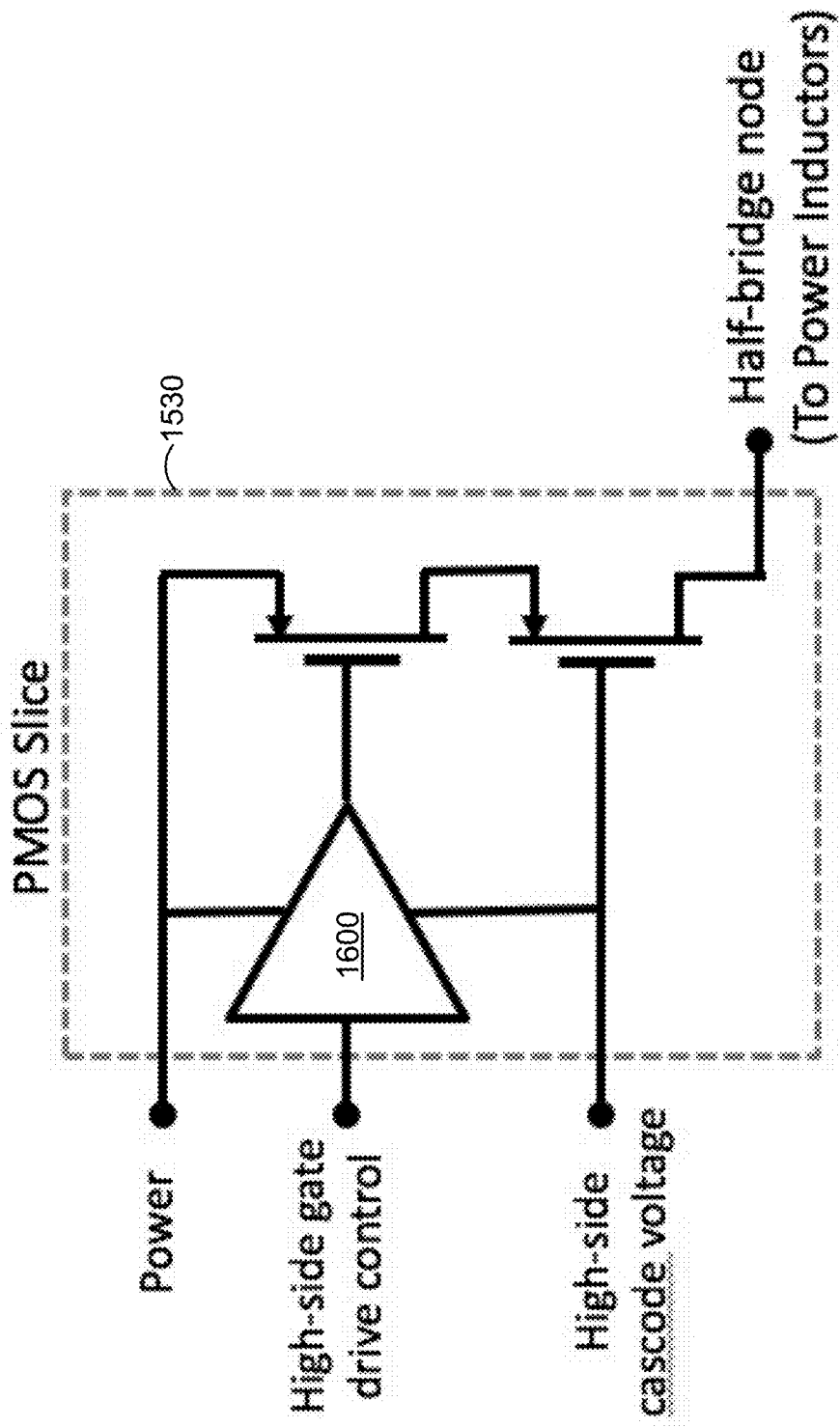
FIG. 16 is a schematic representation of a PMOS slice according to one or more embodiments.
Figure 17:
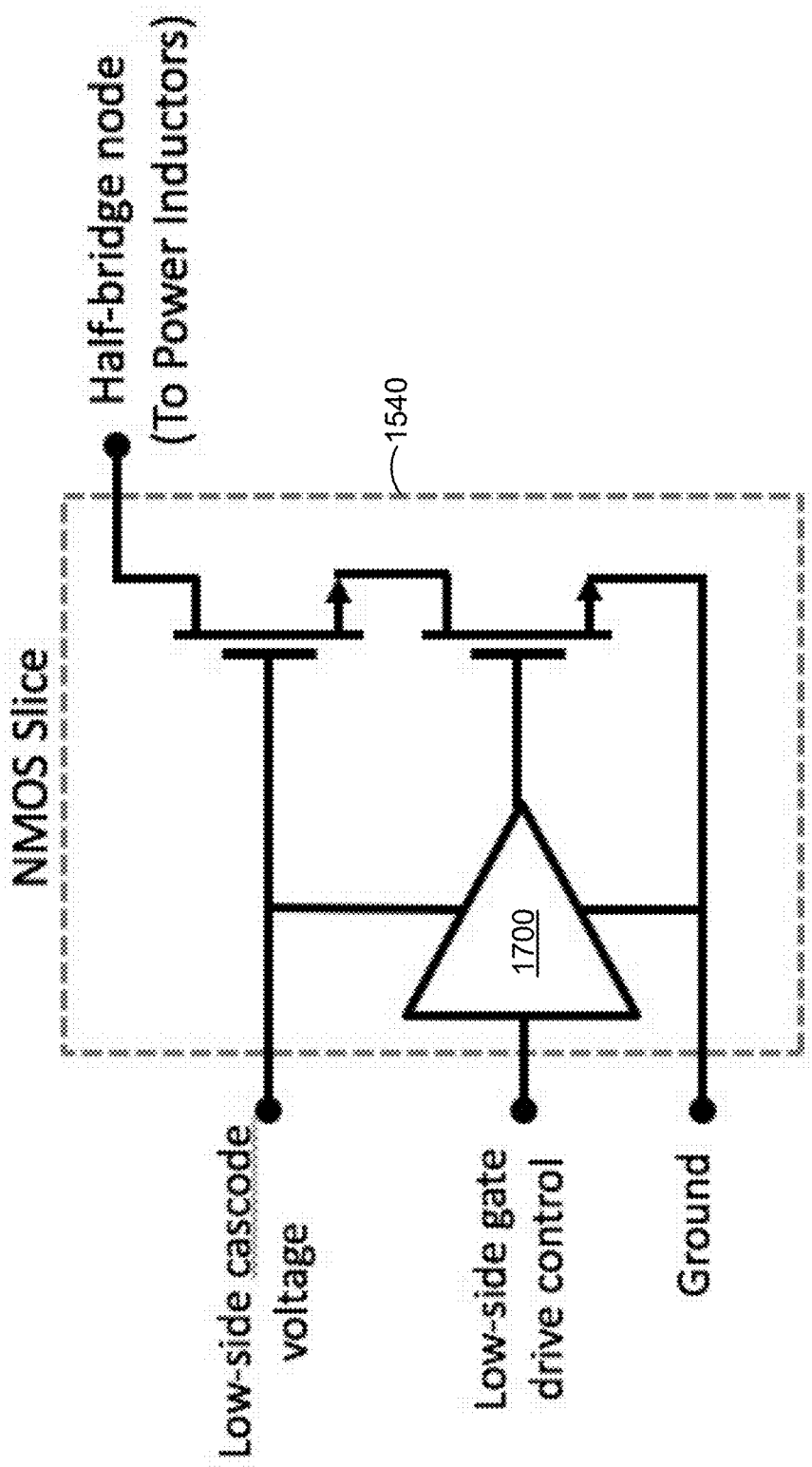
FIG. 17 is a schematic representation of an NMOS slice according to one or more embodiments.

The effective width of power switch 1500 can be increased by including additional switches in parallel electrically with high-side switches 1510 and by including additional switches in parallel electrically with low-side switches 1520. In some embodiments, for example, a PMOS slice 1530 and an NMOS slice 1540 can be defined, as illustrated in FIGS. 15-17. Power switch 150 can include a plurality of PMOS and NMOS slices 1530, 1540. Each PMOS slice 1530 is disposed in parallel electrically with the other PMOS slices 1530, for example in an array. Likewise, each NMOS slice 1540 is disposed in parallel electrically with the other PMOS slices 1530, for example in an array.

By operating each slice 1530, 1540 in parallel electrically, the total effective width of power switch 1500 is N×W_slice, where N is the number of slices and W_slice is the effective transistor channel width for a single slice. Each slice 1530, 1540 includes a gate drive buffer 1600, 1700, respectively. The buffers 1600, 1700 can ensure that there is sufficient drive strength to actuate the transistors in their respective slices 1530, 1540.

Figure 18:
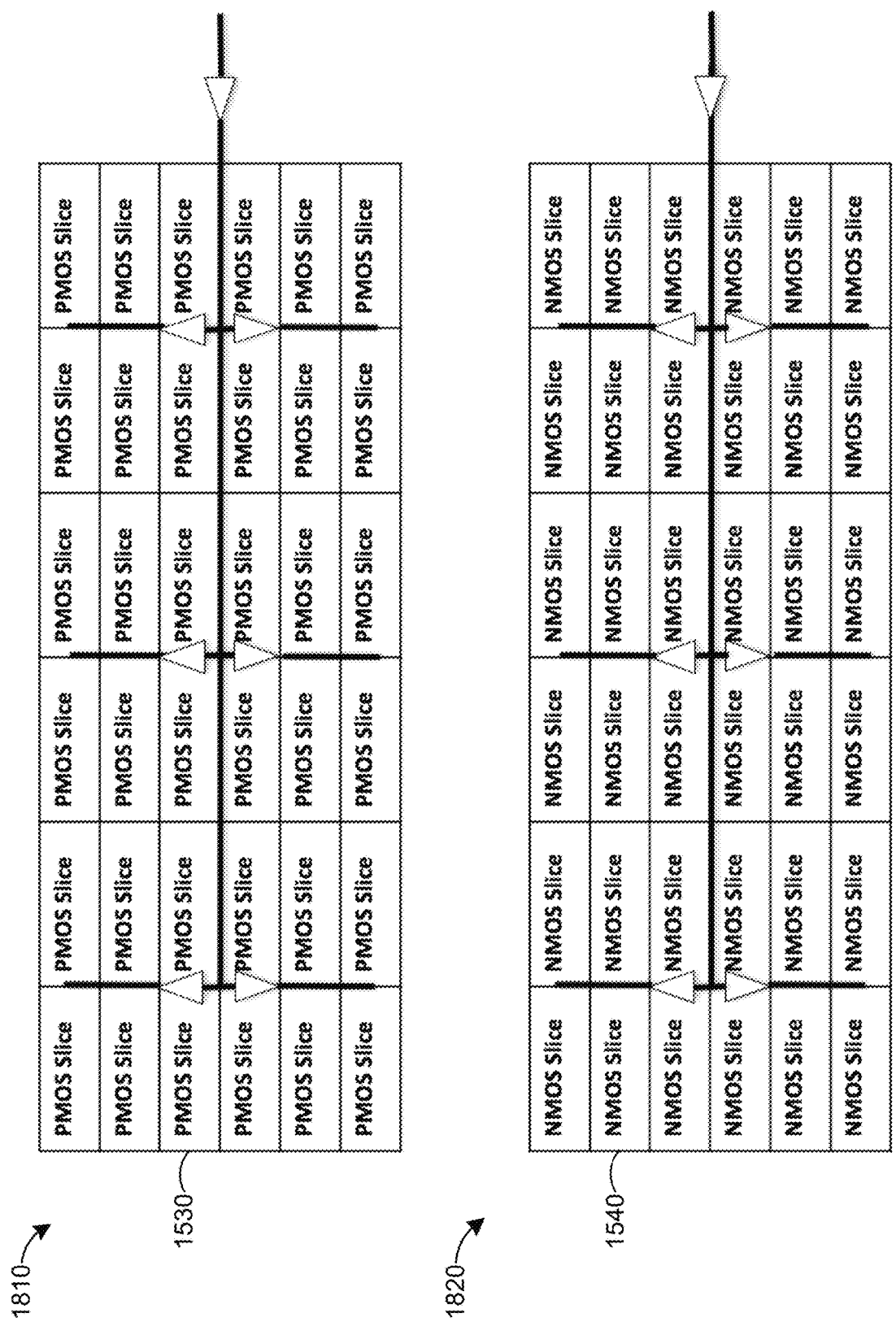
FIG. 18 is an example representation of the physical layout of PMOS and NMOS slices in a power switch.
Figure 19:
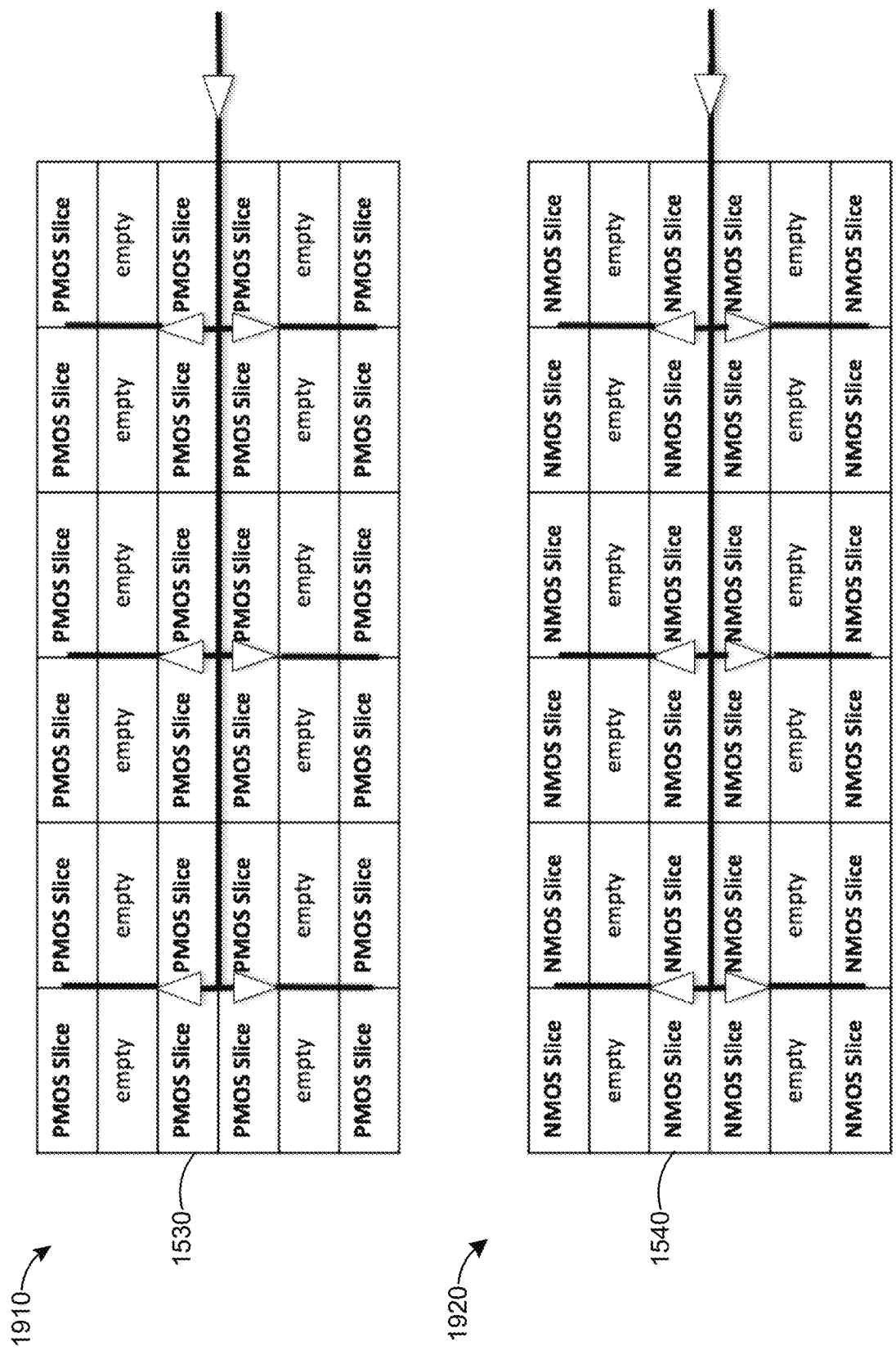
FIG. 19 is another example representation of the physical layout of PMOS and NMOS slices in a power switch.

FIG. 18 is an example representation of the physical layout 1810, 1820 of PMOS and NMOS slices 1530, 1540, respectively, in power switch 1500. In FIG. 18 there are 36 PMOS slices 1530 and 36 NMOS slices 1540. With this physical layout 1810, 1820 of slices, the effective width of power switch 1500 can be conveniently changed according to the expected inductor current for a given power converter design. For example, the effective width of power switch 1500 could be changed dynamically based on the load current. FIG. 19 is another example representation of the physical layout 1910, 1920 of PMOS and NMOS slices 1530, 1540, respectively, in power switch 1500. In FIG. 19 there are 24 PMOS slices 1530 and 24 NMOS slices 1540. Physical layout 1910, 1920 is a regular pattern of PMOS and NMOS slices 1530, 1540, respectively.

Figure 20:
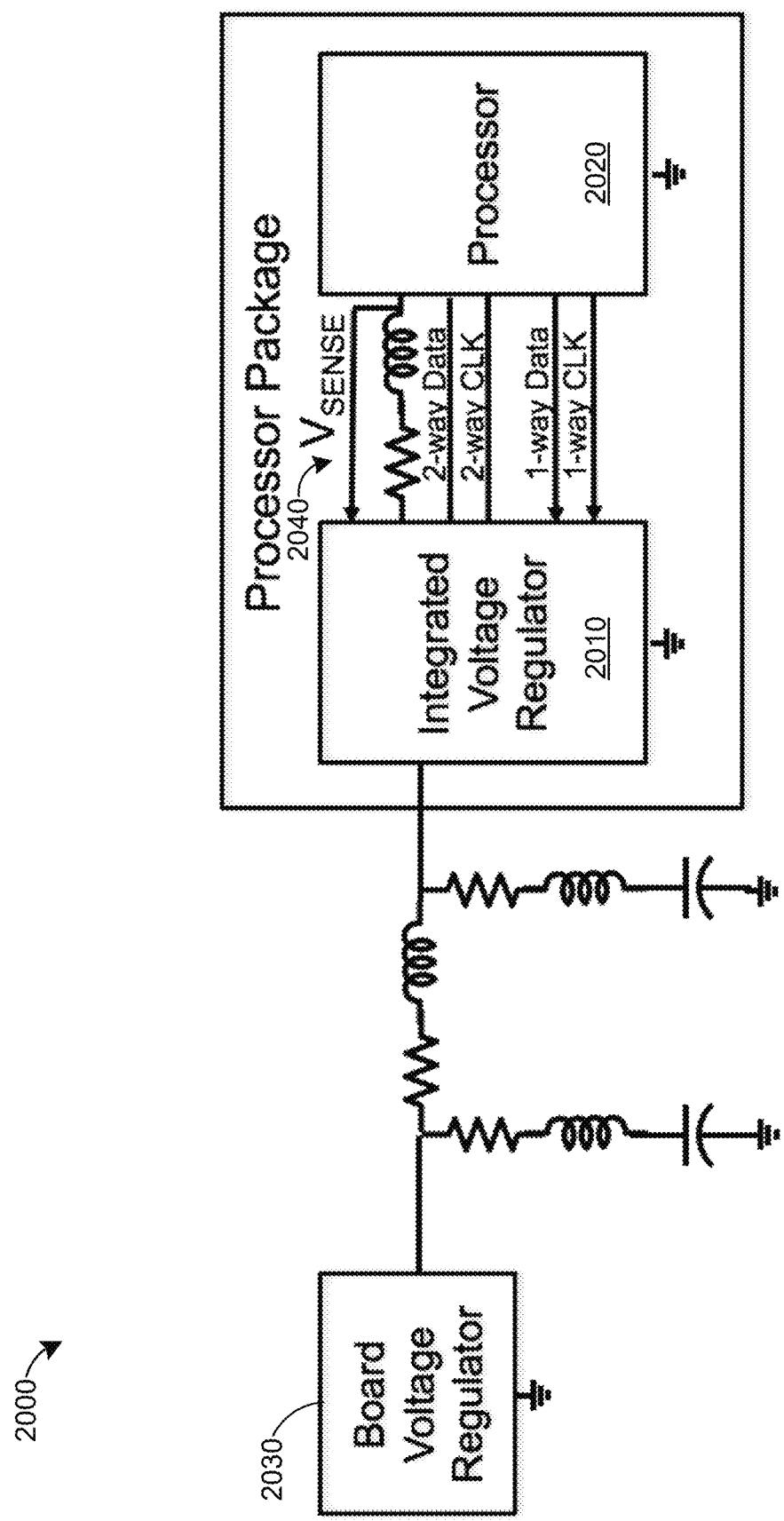
FIG. 20 is a schematic diagram of an assembly that includes a switched inductor DC-DC power converter chiplet, a processor chip, and a board voltage regulator according to one or more embodiments.

FIG. 20 is a schematic diagram of an assembly 2000 that includes a switched inductor DC-DC power converter chiplet 2010, a processor chip 2020, and a board voltage regulator 2030 according to one or more embodiments. The switched inductor DC-DC power converter chiplet 2010 can be the same as switched inductor DC-DC power converter chiplet 10, 50, 1000, 1200, 1300, and/or 1400 described above. In addition, switched power conversion system 90 can include the switched inductor DC-DC power converter chiplet 2010.

FIG. 20 illustrates that the switched inductor DC-DC power converter chiplet 2010 includes two-way and one-way digital interfaces for communication of data and clock signals to and/or from the processor chip 20. A feedback voltage sense line 2040 provides a low-error reading of the supply voltage proximal to or immediately proximal to the processor chip 20 (i.e., the load). In some embodiments, the one-directional serial interfaces can be used to communicate the "power state" of the processor chip 20 so that the power converter chiplet may quickly load pre-programmed operating parameters for the given load IC power state.

Figure 21:
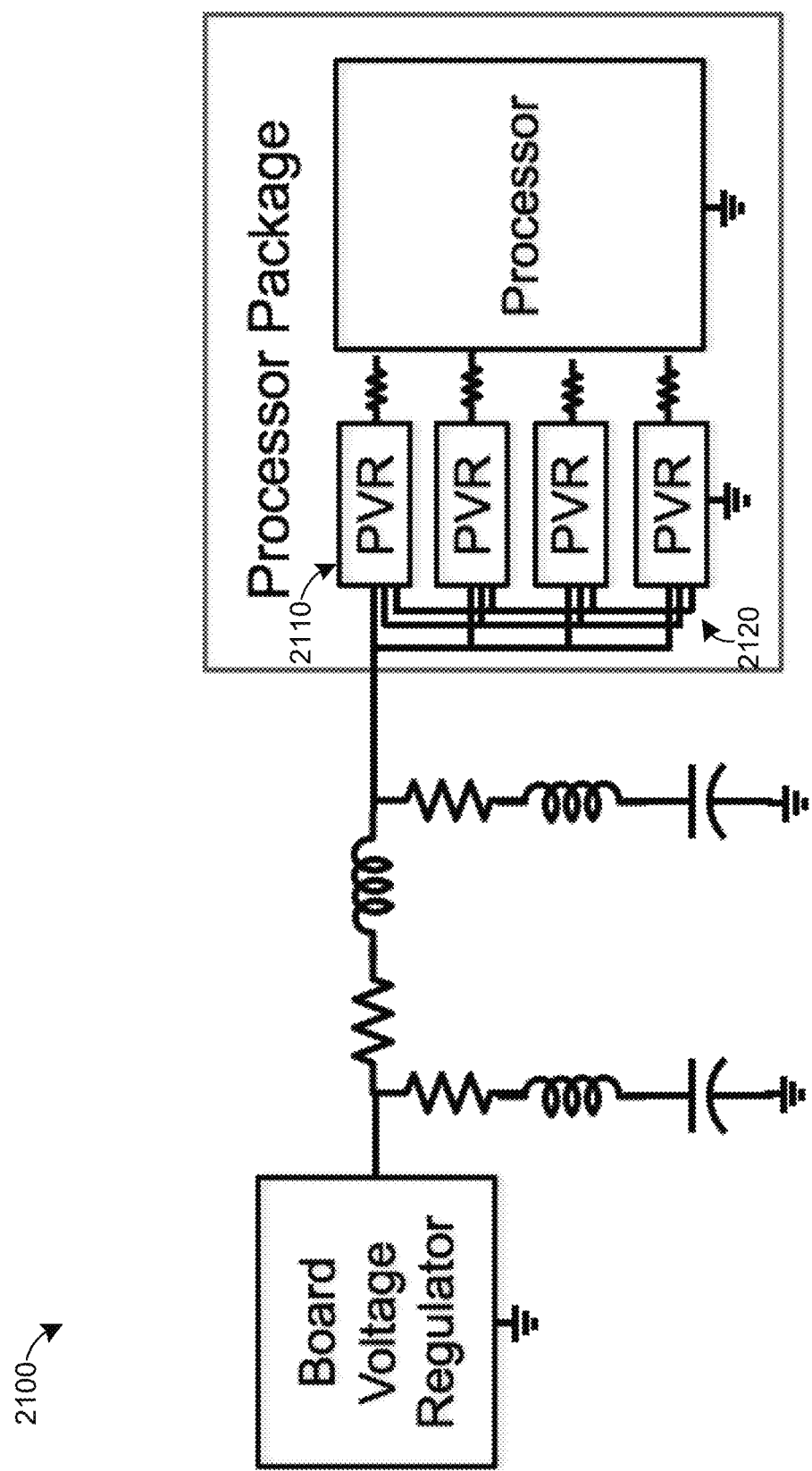
FIG. 21 is a block diagram of an assembly that includes multiple switched inductor DC-DC power converter chiplets that are arranged in parallel electrically with one another according to one or more embodiments.

FIG. 21 illustrates an assembly 2100 that includes multiple switched inductor DC-DC power converter chiplets 2110 can be arranged in parallel electrically with one another to increase the capacity of the power converters, according to one or more embodiments. A two-wire digital serial interface 2120 can be used for information sharing between the different power converter chiplets 2110. For example, the digital serial interface 2120 can be used to maintain a balanced output current such that the output current from each power converter chiplet 2110 is nearly identical. The switched inductor DC-DC power converter chiplets 2110 can be the same as and/or can include switched inductor DC-DC power converter chiplet(s) 10, 50, 1000, 1200, 1300, and/or 1400 described above.

Figure 22:
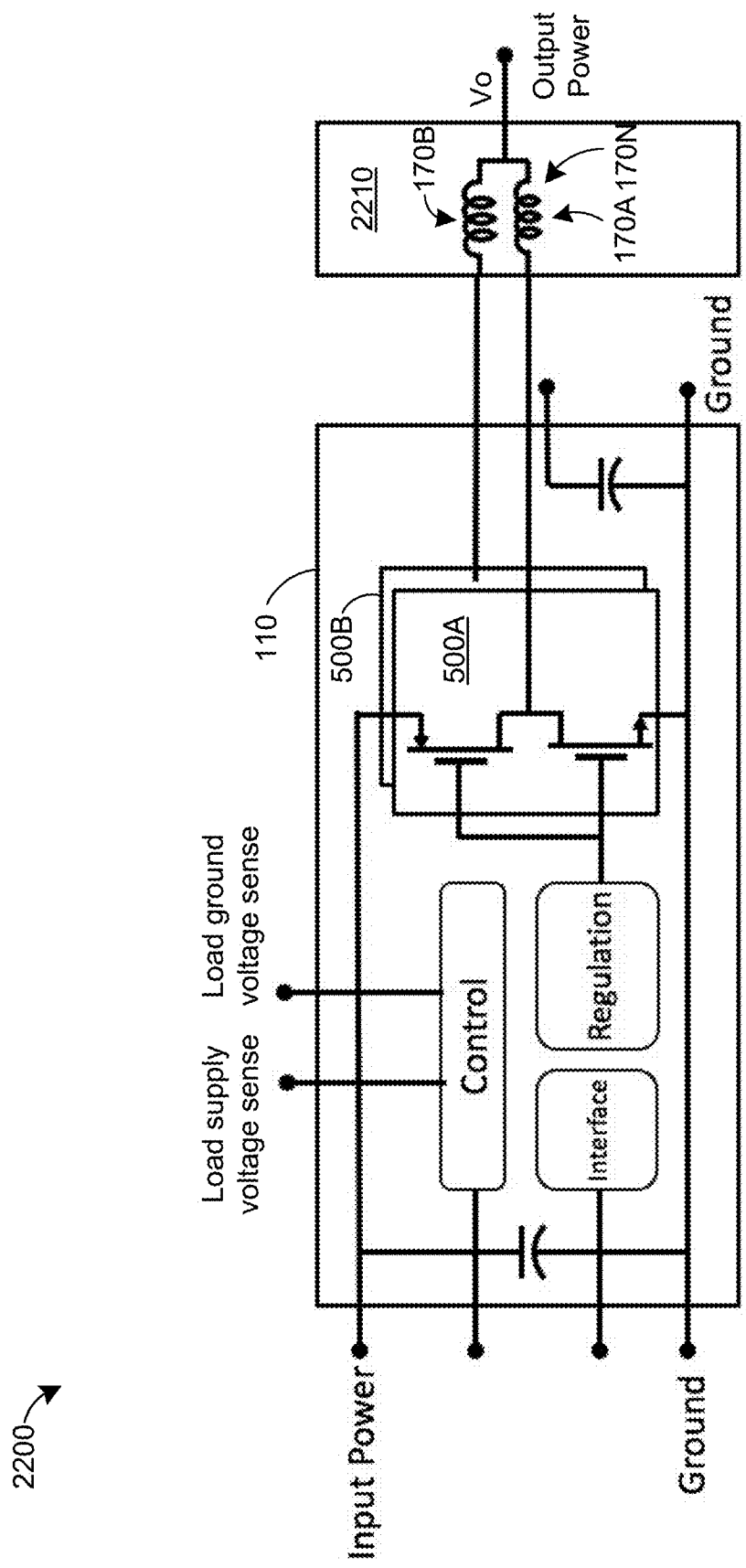
FIG. 22 is a schematic representation of a switched inductor DC-DC power converter chiplet according to one or more embodiments.

FIG. 22 is a schematic representation of a switched inductor DC-DC power converter chiplet 2200 according to one or more embodiments. Switched inductor DC-DC power converter chiplet 2200 is the same or substantially the same as switched inductor DC-DC power converter chiplet 50 except as described below. In FIG. 22, the thin-film inductor(s) 170N are disposed on an interposer 2210 (e.g., a silicon interposer), such as an integrated passive device. The interposer 2210 can be flip-chip attached to the power converter substrate 110. FIG. 22 illustrates that the power converter substrate 110 includes phases 500A, 500B, but it can include only one phase or it can include additional phases (e.g., 500N) in other embodiments.

Figure 23:
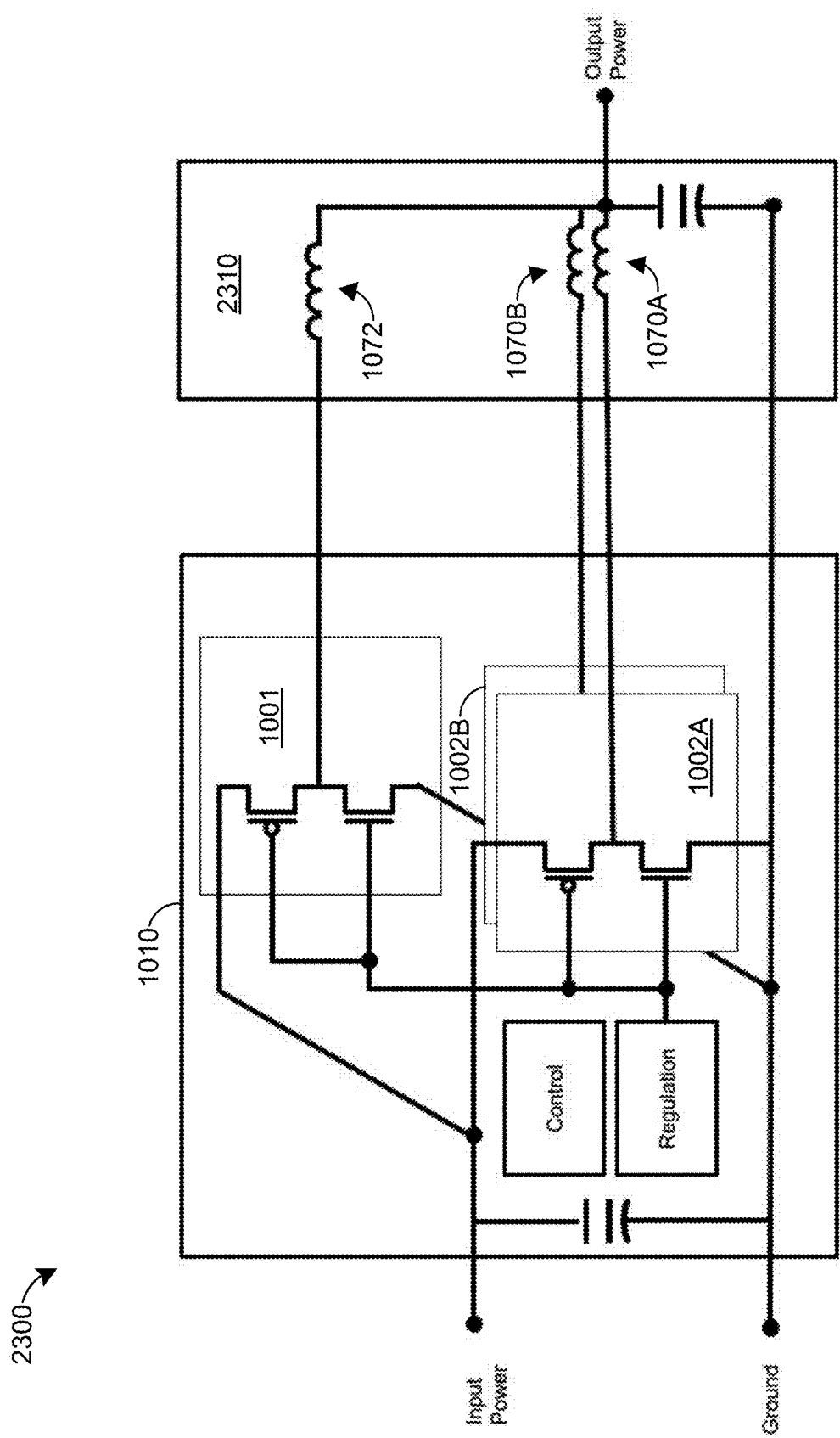
FIG. 23 is a schematic representation of a switched inductor DC-DC power converter chiplet according to one or more alternative embodiments.

FIG. 23 is a schematic representation of a switched inductor DC-DC power converter chiplet 2300 according to one or more alternative embodiments. Switched inductor DC-DC power converter chiplet 2300 is the same or substantially the same as switched inductor DC-DC power converter chiplet 1000 except as described below. In FIG. 23, the thin-film inductors 1070A, 1070B (i.e., 1070N) and 1072 are disposed on an interposer 2310 (e.g., a silicon interposer), such as an integrated passive device. The interposer 2310 can be flip-chip attached to the power converter substrate 1010. FIG. 23 illustrates that the power converter substrate 1010 includes second powertrain phases 1002A, 1002B, but it can include only one second powertrain phase or it can include additional second powertrain phases (e.g., 1002N) in other embodiments.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

What is claimed is:

1. A switched inductor DC-DC power converter, comprising:
   a first powertrain phase having a first maximum power conversion efficiency at a first load current and comprising:
      a first power switch; and
      a first thin-film inductor electrically coupled to an output of the first power switch;
   second powertrain phases in parallel electrically with one another and in parallel electrically with the first powertrain phase, each second powertrain phase having a second maximum power conversion efficiency at a second load current and comprising:
      a second power switch; and
      a second thin-film inductor electrically coupled to an output of the second power switch; and
   control circuitry in electrical communication with the first and second powertrain phases, the control circuitry varying a number of the first and second powertrain phases that are electrically coupled to a power delivery channel, the number varied to maximize a power conversion efficiency for delivering an output current to a load,
   wherein:
      the first load current is different than the second load current,
      only the first powertrain phase is electrically coupled to the power delivery channel when a target output current is less than or equal to a threshold output current,
      at least one second powertrain phase is electrically coupled to the power delivery channel when the target output current is greater than the threshold output current,
      two second powertrain phases are electrically coupled to the power delivery channel when the target output current is twice the second load current or higher.

2. The switched inductor DC-DC power converter of claim 1, wherein M second powertrain phases are electrically coupled to the power delivery channel when the target output current is at least M multiplied by the second load current, wherein M is an integer greater than or equal to 2.

3. The switched inductor DC-DC power converter of claim 1, wherein the threshold output current is 100 mA.

4. The switched inductor DC-DC power converter of claim 1, wherein the first load current is 50 mA.

5. The switched inductor DC-DC power converter of claim 1, wherein the second load current is 500 mA.

6. The switched inductor DC-DC power converter of claim 1, further comprising an output capacitor in parallel electrically with the power delivery channel.

7. The switched inductor DC-DC power converter of claim 6, wherein the first powertrain includes a first LC filter that comprises the first thin-film inductor and the output capacitor, and each second powertrain includes a second LC filter that comprises the second thin-film inductor and the output capacitor.

8. The switched inductor DC-DC power converter of claim 1, wherein the control circuitry regulates a switching frequency and duty cycle of the first and second power switches to adjust the output current such that is equal to a target output current.

9. The switched inductor DC-DC power converter of claim 1, wherein the switched inductor DC-DC power converter is integrated on a common substrate.

10. The switched inductor DC-DC power converter of claim 1, wherein the switched inductor DC-DC power converter is integrated on a common substrate that comprises a multilevel wiring network, and the first thin-film inductor and each second thin-film inductor are integrated in the multilevel wiring network.

11. The switched inductor DC-DC power converter of claim 10, wherein:
   the multilevel wiring network includes first and second integration layers, and
   the first thin-film inductor and each second thin-film inductor are integrated in the first and second integration layers.

12. The switched inductor DC-DC power converter of claim 10, wherein:
   the multilevel wiring network includes first, second, third, and fourth integration layers,
   each second thin-film inductor is integrated in the first and second integration layers, and
   the first thin-film inductor is integrated in the third and fourth integration layers.

13. The switched inductor DC-DC power converter of claim 12, wherein the first and second integration layers are disposed closer to the substrate than the third and fourth integration layers.

14. The switched inductor DC-DC power converter of claim 10 wherein:
   the multilevel wiring network includes first, second, and third integration layers,
   the second thin-film inductors comprise first and second thin-film solenoid inductors that are integrated in the first and second integration layers, the first and second thin-film solenoid inductors including respective first and second ferromagnetic cores,
   the first thin-film inductor comprises a thin-film spiral inductor that is integrated in a third integration layer, and
   the thin-film spiral inductor includes at least a portion of the first and second ferromagnetic cores.

15. A switched inductor DC-DC power converter, comprising:
- a first powertrain phase having a first maximum power conversion efficiency at a first load current and comprising:
  - a first power switch; and
  - a first thin-film inductor electrically coupled to an output of the first power switch;
- second powertrain phases in parallel electrically with one another and in parallel electrically with the first powertrain phase, each second powertrain phase having a second maximum power conversion efficiency at a second load current and comprising:
  - a second power switch; and
  - a second thin-film inductor electrically coupled to an output of the second power switch; and
- control circuitry in electrical communication with the first and second powertrain phases, the control circuitry varying a number of the first and second powertrain phases that are electrically coupled to a power delivery channel, the number varied to maximize a power conversion efficiency for delivering an output current to a load,
- wherein:
  - the first load current is different than the second load current, and
  - the switched inductor DC-DC power converter is integrated on a common substrate that comprises a multilevel wiring network, and the first thin-film inductor and each second thin-film inductor are integrated in the multilevel wiring network.

16. The switched inductor DC-DC power converter of claim 15, wherein:
- the multilevel wiring network includes first and second integration layers, and
- the first thin-film inductor and each second thin-film inductor are integrated in the first and second integration layers.

17. The switched inductor DC-DC power converter of claim 15, wherein:
- the multilevel wiring network includes first, second, third, and fourth integration layers,
- each second thin-film inductor is integrated in the first and second integration layers, and
- the first thin-film inductor is integrated in the third and fourth integration layers.

18. The switched inductor DC-DC power converter of claim 17, wherein the first and second integration layers are disposed closer to the substrate than the third and fourth integration layers.

19. The switched inductor DC-DC power converter of claim 15 wherein:
- the multilevel wiring network includes first, second, and third integration layers,
- the second thin-film inductors comprise first and second thin-film solenoid inductors that are integrated in the first and second integration layers, the first and second thin-film solenoid inductors including respective first and second ferromagnetic cores,
- the first thin-film inductor comprises a thin-film spiral inductor that is integrated in a third integration layer, and
- the thin-film spiral inductor includes at least a portion of the first and second ferromagnetic cores.

* * * * *